United States Patent
Hutton et al.

(10) Patent No.: US 7,042,248 B1
(45) Date of Patent: May 9, 2006

(54) DEDICATED CROSSBAR AND BARREL SHIFTER BLOCK ON PROGRAMMABLE LOGIC RESOURCES

(75) Inventors: Michael Hutton, Moutain View, CA (US); Sinan Kaptanoglu, Belmont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/454,728

(22) Filed: Jun. 3, 2003

(51) Int. Cl.
*H03K 19/177* (2006.01)
(52) U.S. Cl. .............................. 326/41; 326/38; 326/47
(58) Field of Classification Search ............ 326/37–41, 326/47, 101
See application file for complete search history.

(56) References Cited

U.S. PATENT DOCUMENTS

| | | | |
|---|---|---|---|
| 6,060,903 A | 5/2000 | Rangasayee et al. | 326/39 |
| 6,271,680 B1 * | 8/2001 | Mendel et al. | 326/40 |
| 6,289,494 B1 * | 9/2001 | Sample et al. | 716/12 |
| 6,404,225 B1 | 6/2002 | Rangasayee | 326/39 |
| 6,538,470 B1 | 3/2003 | Langhammer et al. | 326/41 |
| 6,590,417 B1 * | 7/2003 | Jones et al. | 326/39 |
| 2003/0141898 A1 * | 7/2003 | Langhammer et al. | 326/40 |
| 2004/0075469 A1 * | 4/2004 | Reblewski et al. | 326/93 |

OTHER PUBLICATIONS

U.S. Appl. No. 10/383,304, filed Mar. 5, 2003, Ali H. Burney et al.
U.S. Appl. No. 10/383,312, filed Mar. 5, 2003, Ali H. Burney et al.

* cited by examiner

*Primary Examiner*—Anh Q. Tran
(74) *Attorney, Agent, or Firm*—Fish & Neave IP Group Ropes & Gray LLP

(57) ABSTRACT

A dedicated hardware block is provided for implementing crossbars and/or barrel shifters in programmable logic resources. Crossbar and/or barrel shifter circuitry may replace one or more rows, one or more columns, one or more rectangles, or any combination thereof of programmable logic regions on a programmable logic resource. The functionality of the crossbar and/or barrel shifter circuitry can further be improved by implementing time-multiplexing.

15 Claims, 19 Drawing Sheets

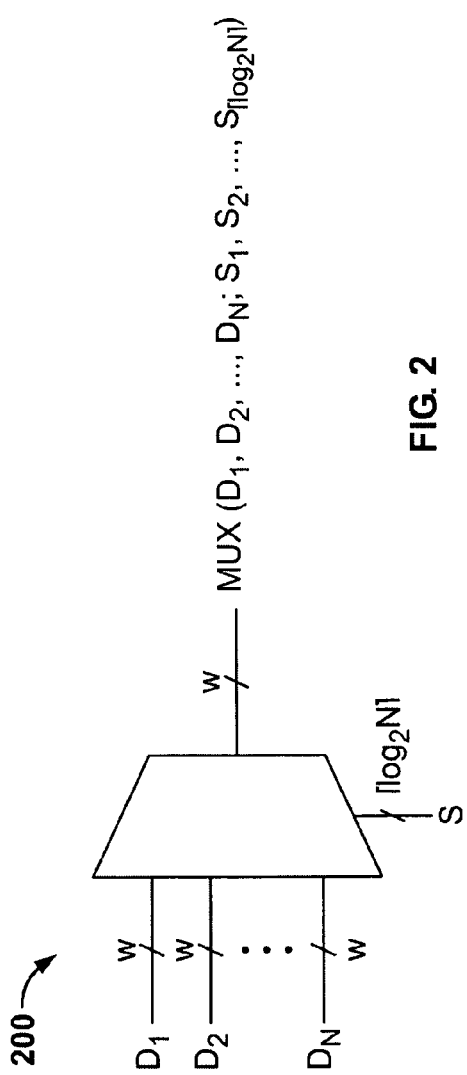
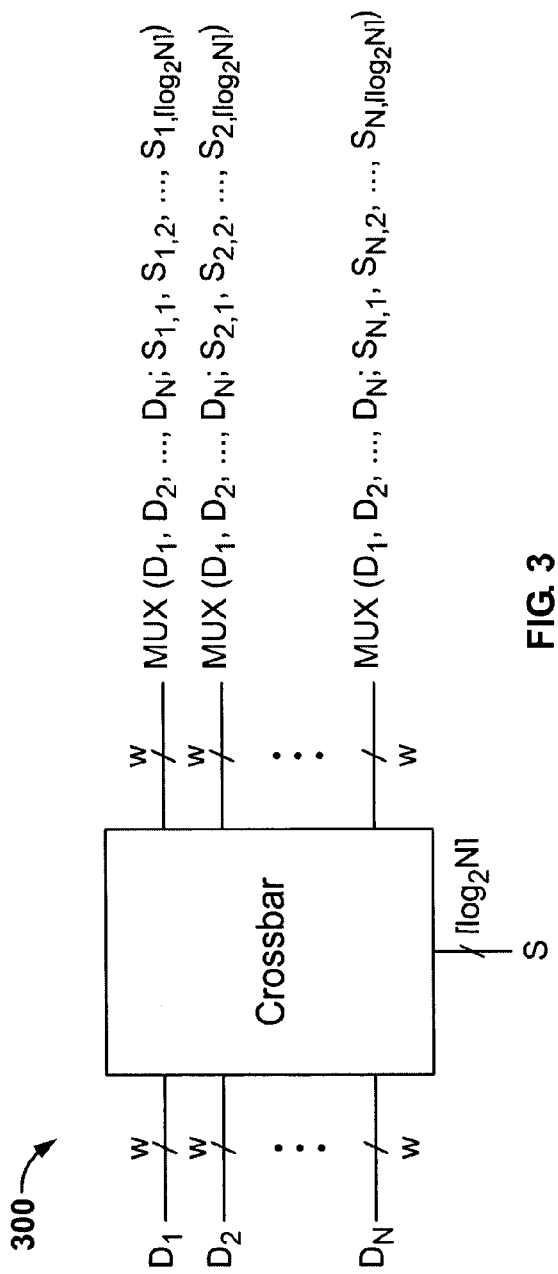

| CLK | D-in | R0 | R1-A | R1-B | R2 | R3 | S-out |
|-----|------|------|------|------|------|------|-------|
| 1 | D0-A | D0-A | X | X | X | X | X |
| 2 | D0-B | D0-B | D0-A | X | X | X | X |
| 3 | D1-A | D1-A | D0-A | D0-B | S0-A | S0-B | X |
| 4 | D1-B | D1-B | D1-A | D0-B | S0-A | S0-A | S0-B |
| 5 | D2-A | D2-A | D1-A | D1-B | S1-A | S1-B | S0-A |
| 6 | D2-B | D2-B | D2-A | D1-B | S1-A | S1-A | S1-B |
| 7 | D3-A | D3-A | D2-A | D2-B | S2-A | S2-B | S1-A |
| 8 | D3-B | D3-B | D3-A | D2-B | S2-A | S2-A | S2-B |
| 9 | D4-A | D4-A | D3-A | D3-B | S3-A | S3-B | S2-A |
| 10 | D4-B | D4-B | D4-A | D3-B | S3-A | S3-A | S3-B |

FIG. 14

DEDICATED CROSSBAR AND BARREL SHIFTER BLOCK ON PROGRAMMABLE LOGIC RESOURCES

BACKGROUND OF THE INVENTION

This invention relates to programmable logic resources. More particularly, this invention relates to providing a dedicated crossbar and/or barrel shifter block on programmable logic resources.

Programmable logic resources, such as programmable logic devices (PLDs) and field-programmable gate arrays (FPGAs), typically include many regions of programmable logic that are interconnectable in any of many different ways by programmable interconnection resources. Each logic region is programmable to perform any of several logic functions on input signals applied to that region from the interconnection resources. As a result of the logic functions it performs, each logic region produces one or more output signals that are applied to the interconnection resources.

The interconnection resources typically include drivers, interconnection conductors, and programmable switches for selectively making connections between various interconnection conductors. The interconnection resources can generally be used to connect any logic region output to any logic region input; although to avoid having to devote a disproportionately large fraction of the device to interconnection resources, it is usually the case that only a subset of all possible interconnections can be made in any given programmed configuration of the programmable logic resource. Indeed, this last point is very important in the design of programmable logic resources because interconnection resources must always be somewhat limited in programmable logic resources having large logic capacity, and interconnection arrangements must therefore be provided that are flexible, efficient, and of adequate capacity without displacing excessive amounts of other resources such as logic.

Programmable logic resources also include memory regions, data registers, address registers, and digital signal processing (DSP) regions. The memory regions can be used as random access memory (RAM), read-only memory (ROM), content addressable memory (CAM), product term (p-term) logic, embedded array blocks (EABs), and other types of memories. The data registers can be used to route data and control signals. The address registers can be used to route signals to different addresses in the programmable logic resources. The DSP regions can be used for signal or data processing tasks.

The programmable logic resource typically includes circuitry such as conductors and connectors for providing interconnect resources between the programmable logic regions, memory regions, data registers, address registers, and DSP regions (e.g., special purpose hardware for implementing multiplication functions). In addition, global interconnect resources can be used to apply input signals to, and output signals from, the different regions.

Crossbars and barrel shifters are commonly used in programmable logic resources in many switching applications including, for example, local area network (LAN), asynchronous transfer mode (ATM), networking, telecommunications, digital signal processing, and multiprocessing systems. A crossbar reorders input data to send to its output. For example, in many networking applications, a crossbar receives an incoming burst of data that contains some data, such as a packet header, that is no longer needed once the data reaches the crossbar. The crossbar can then separate the unnecessary or invalid data from the valid data. A barrel shifter aligns data by shifting the data to an appropriate storage location. For example, when there are unused storage locations between two sets of data, the barrel shifter will shift the data to remove the unused storage locations.

Crossbars and barrel shifters are typically implemented using multiplexers. Multiplexers are well-known elements commonly used in logic circuitry. Known techniques for implementing a multiplexer generally rely on some aspect of decoding a control signal being sent to the multiplexer in order to determine which of the input signals should be selected as an output. Thus, additional decoding circuitry is used and additional clock cycles are required for the decoding process to complete.

A multiplexer is implemented in a programmable logic resource using lookup tables ("LUTs") or logic elements ("LEs"), the inputs of which are sent into a logic gate that, in turn, outputs the output of the multiplexer. For example, a single four-input LUT (a common size implemented in commercial programmable logic resources) can be configured to implement a 2-input, 1-output (2:1) multiplexer by using one of the LUT's inputs as a selection criterion signal and two other inputs as input signals. To build more complex multiplexers, two or more LUTs can be coupled together using programmable connectors. For example, to implement a four-input, 1-output (4:1) multiplexer, three LUTs can be used. Two LUTs, each implementing a 2:1 multiplexer with a first selection criterion signal, can have its outputs coupled to the inputs of a third LUT that implements a 2:1 multiplexer with a second selection criterion signal. The output of the third LUT is the output of the 4:1 multiplexer.

Crossbars and barrel shifters require a large number of multiplexers to implement. Because modern networking applications require large amounts of crossbar selection and barrel shifter functionality in programmable logic resources, the current implementation of crossbars and barrel shifters in programmable logic resources is very inefficient because of the large requirement of logic elements.

In view of the foregoing, it would be desirable to provide a more efficient implementation of crossbars and/or barrel shifters in programmable logic resources.

SUMMARY OF THE INVENTION

In accordance with the invention, dedicated circuitry is provided for implementing crossbars and/or barrel shifters in programmable logic resources. The crossbars and/or barrel shifters can be implemented using dedicated hardware circuitry rather than using logic elements. A programmable logic resource may include a plurality of programmable logic regions and one or more crossbar and/or barrel shifter regions. The regions may be arranged in different areas on the programmable logic resource.

Global interconnect resources may be used to apply input signals to the crossbar and/or barrel shifter region. The global interconnection resources may also be used to route output signals from the crossbar and/or barrel shifter block. In another embodiment, the crossbar and/or barrel shifter block may use some of the local interconnect resources of the neighboring programmable logic regions, registers, and/or memory.

A programmable logic resource may include a column of programmable logic regions and may include a crossbar and/or barrel shifter block in multiple rows in that column. In another embodiment, a programmable logic resource may include a row of programmable logic regions and may include a crossbar and/or barrel shifter block in multiple columns in that row. In yet another embodiment, a programmable logic resource may include a two-dimensional array of programmable logic regions and may include a crossbar and/or barrel shifter block in multiple contiguous rows and columns in that array.

The design of a dedicated crossbar and/or barrel shifter in hardware can include the following: creation of an abstract model, synthesizing the model to a gate-level design, and determing the placement of the gates and the routing of the interconnections.

The use of a dedicated crossbar and/or barrel shifter in hardware on a programmable logic resource does not require logic elements to be implemented, reducing the overall number of logic elements in the programmable logic resource. Further hardware savings can be achieved by implementing time-multiplexing on the crossbar and/or barrel shifter. For example, in a pipelined barrel shifter block, the inputs and outputs can be pipelined to allow a larger barrel shifter that may otherwise be limited by current input and output conditions on a programmable logic resource.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which:

FIG. 2 is a diagram illustrating a logical representation of a multiplexer;

FIG. 3 is a high level diagram illustrating a crossbar implementation;

FIGS. 14–15 are timing diagrams of data being sent through the illustrative pipelined barrel shifter of FIG. 13 in accordance with the invention.

DETAILED DESCRIPTION

Figure 1:
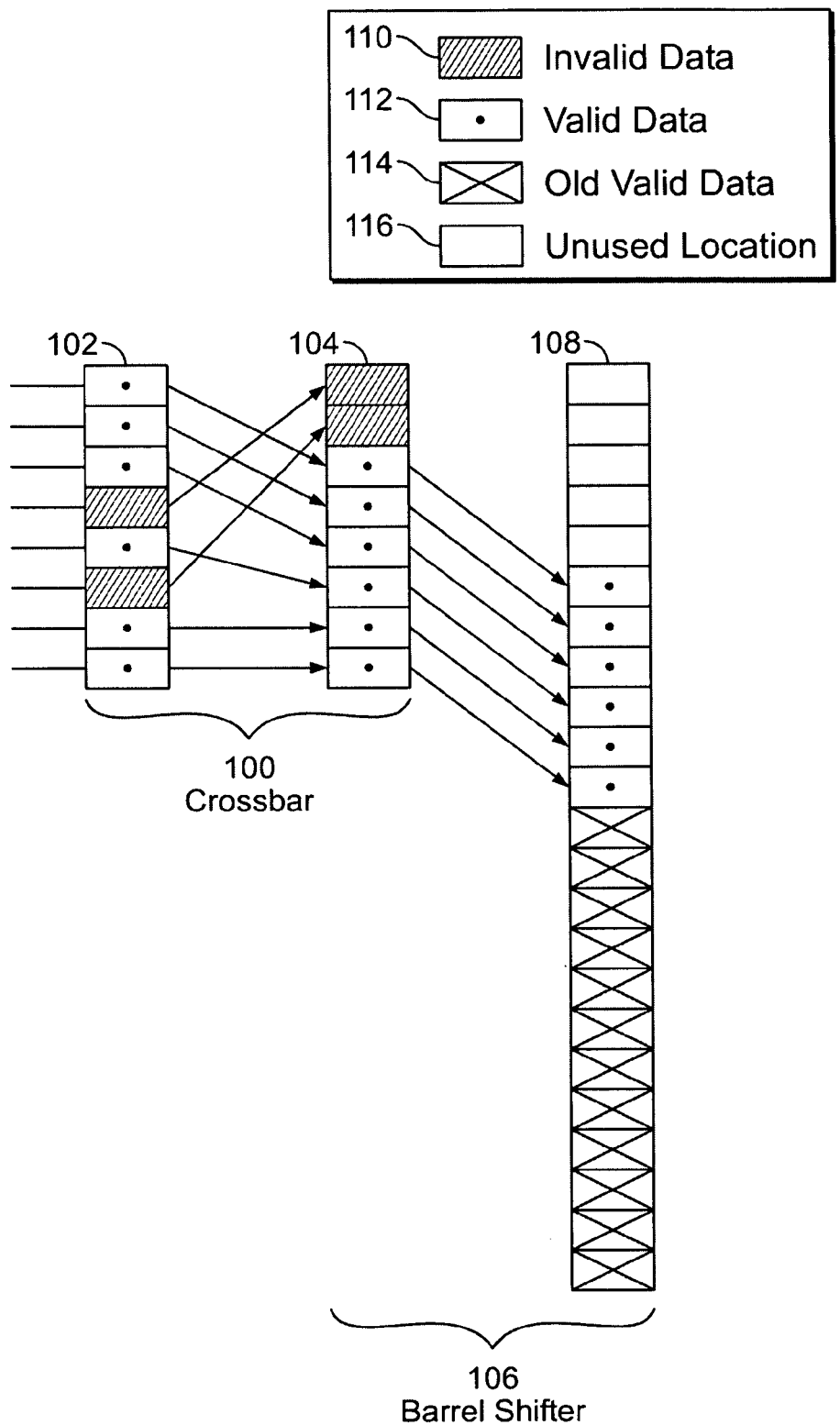
FIG. 1 is a diagram illustrating an application of a crossbar and barrel shifter.

FIG. 1 illustrates an application of a crossbar 100 and barrel shifter 106. An N-input N-output ("N×N") crossbar implements a logic function that allows any of the N input values to be generated on any of the N output values. Each input and output signal can be of 1-bit width or a bus of any other suitable number of bits. For example, crossbar 100 is an 8×8 crossbar that can be of one-word (e.g., 16-bit) width. Input data 102 can include, for example, valid data 112 and unnecessary or invalid data 110. Crossbar 100 can reorder input data 102 to generate output data 104 such that valid data 112 is grouped together and invalid data 110 is grouped together.

An N-channel barrel shifter shifts all or a portion of the data by a number of locations in order to align the data. Similar to the crossbar, each channel can be of 1-bit width or have a width of any other suitable number of bits. Barrel shifter 106 shifts the valid data 112 by three locations to remove any unused locations 116 between valid data 112 and old valid data 114 at output data 108. A barrel shifter can be a uni-directional barrel shifter, in which data shifts in one direction, or a rotational barrel shifter, where data that is shifted out at one end is shifted into an opposite end.

Crossbars and barrel shifters can be implemented in various ways. In some applications, the output of a crossbar can be loaded into a barrel shifter as illustrated in FIG. 1. In other applications, the output of a barrel shifter can be loaded into a crossbar. In yet other applications, other intervening circuitry can separate the crossbar and barrel shifter. Additional applications may use only a crossbar or only a barrel shifter.

Crossbars and barrel shifters are generally implemented using multiplexers. As shown in FIG. 2, a multiplexer block 200 of data width w is a combinatorial logic function that selects as its output (MUX($D_1, D_2, \ldots, D_N; S_1, S_2, \ldots, S_{\lceil \log_2 N \rceil}$)) one of its inputs ($D_1, D_2, \ldots, D_N$). The output is determined by a control signal (S) that has at least a number of bits ($\lceil \log_2 N \rceil$) that can be used to represent all the inputs. The notation "$\lceil \log_2 N \rceil$," also notated as "ceiling ($\log_2 N$)," means to perform the operation "$\log_2 N$" and, if the result is not an integer, to round up the result to the next nearest integer. For example, for a 12-input bus, $\lceil \log_2 12 \rceil = \lceil 3.58 \rceil = 4$. The ceiling of any real number greater than integer X and less than or equal to integer (X+1) is (X+1).

Figure 4:
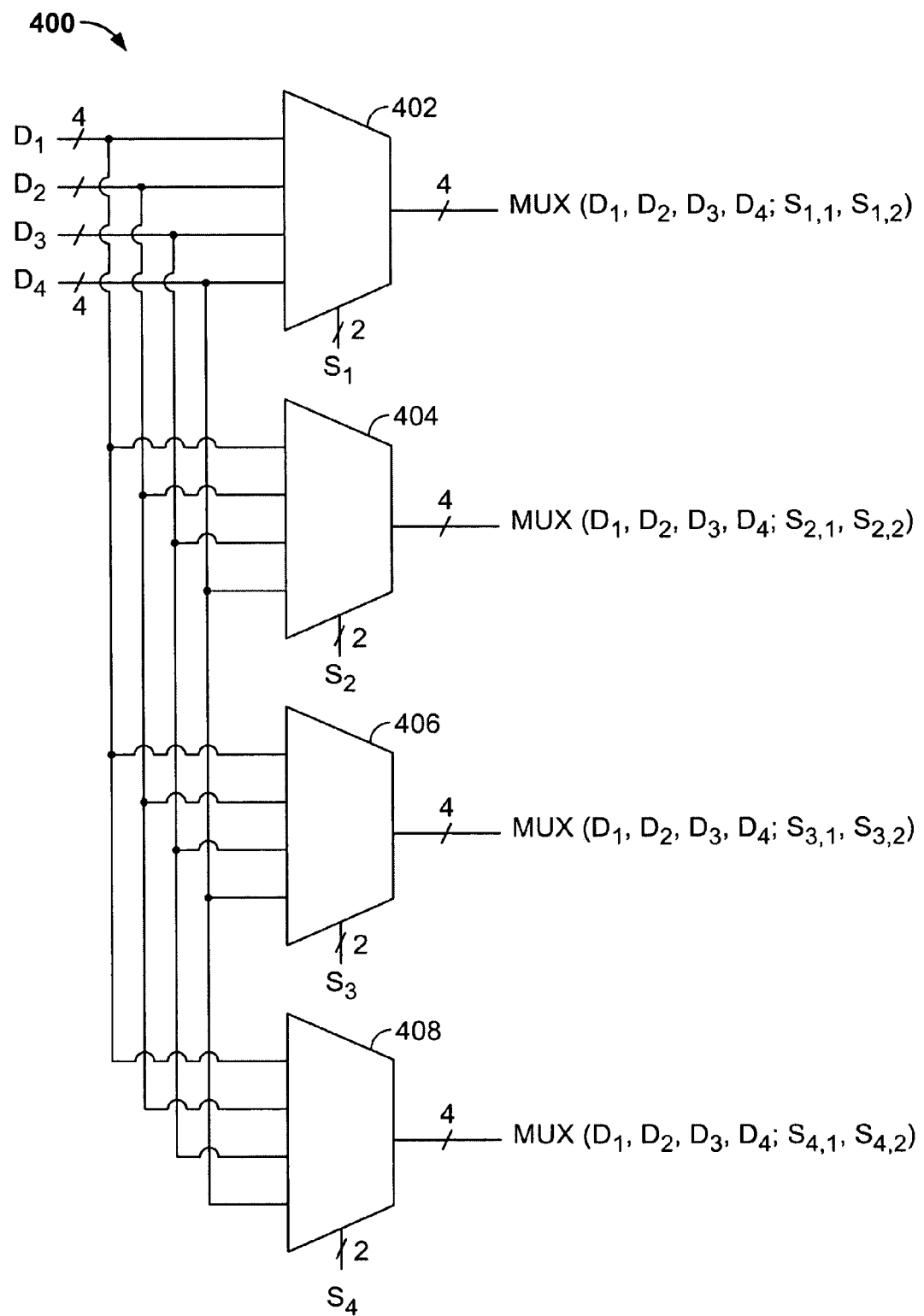
FIG. 4 is a diagram illustrating one example of the crossbar in FIG. 3 using a logical representation of multiplexers.

For an N-input N-output crossbar 300 of data width w shown in FIG. 3, each output is generated from a multiplexer block. For example, as shown in FIG. 4, a 4×4 crossbar 400, with each input bus having four data bits, can be implemented using four multiplexer blocks 402, 404, 406, and 408. Each multiplexer block 402, 404, 406, and 408 has the same inputs ($D_1, D_2, D_3, D_4$) that are each of four-bit width. The output of each multiplexer block 402, 404, 406, and 408, which is also of four-bit width, is determined by a different control signal $S_1, S_2, S_3$, and $S_4$, respectively, each of which is at least two bits.

Figure 5A:
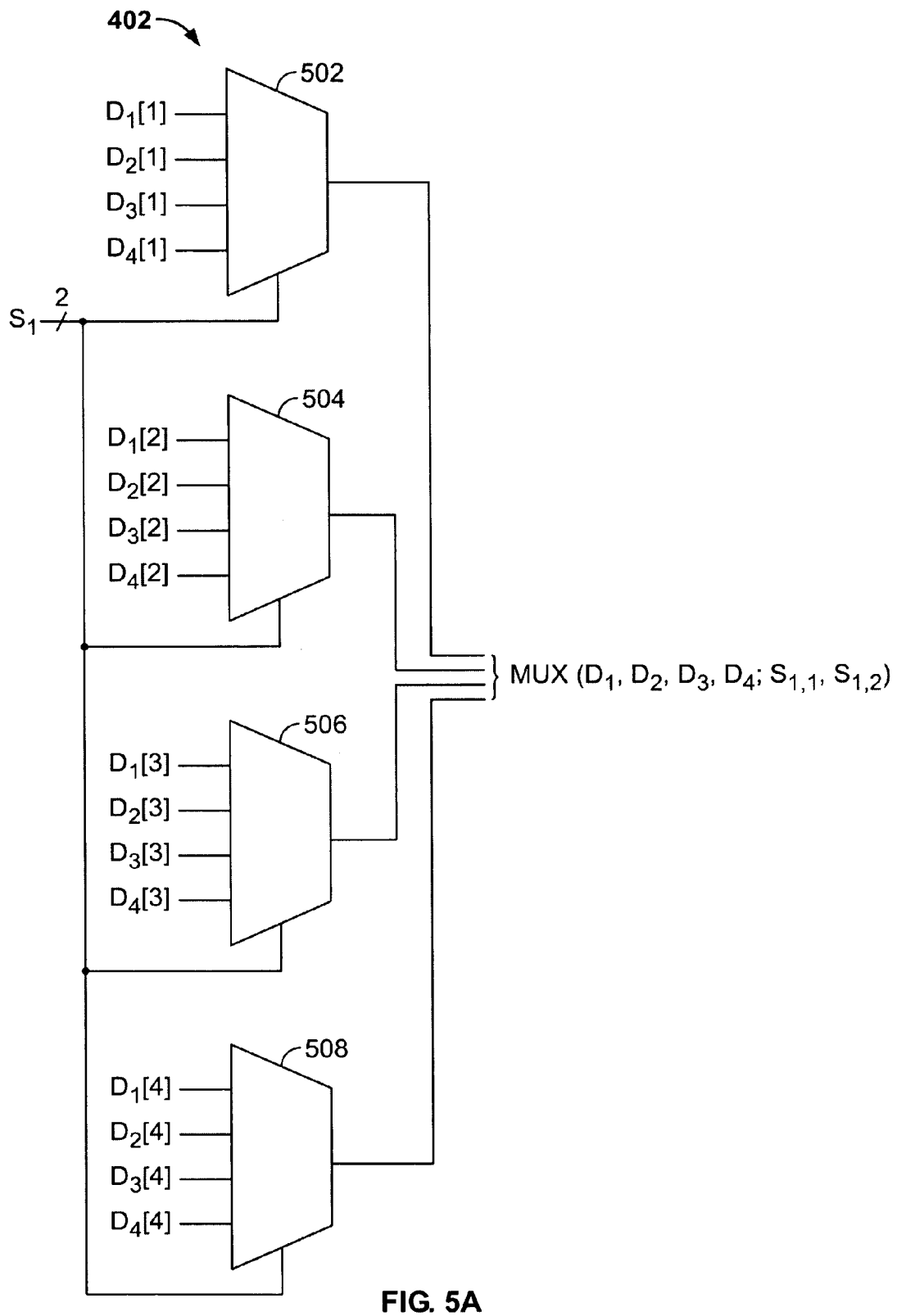
FIG. 5A is a more detailed diagram illustrating one channel of the multiplexers in FIG. 4.

Each of multiplexer blocks 402, 404, 406, and 408 can be implemented the same way. For example, multiplexer block 402 can be implemented using four 4:1 multiplexers 502, 504, 506, and 508 as shown in FIG. 5A. Each multiplexer 502, 504, 506, and 508 takes as input one bit from each of the inputs ($D_1$, $D_2$, $D_3$, $D_4$). The same bit value from each input is coupled to the same multiplexer 502, 504, 506, and 508. For example, a first bit value from each input ($D_1[1]$, $D_2[1]$, $D_3[1]$, $D_4[1]$) may be input to multiplexer 502, a second bit value from each input ($D_1[2]$, $D_2$ [2], $D_3$ [2], $D_4[2]$) may be input to multiplexer 504, etc. Multiplexers 502, 504, 506, and 508 are coupled to the same control signal $S_1$ having two bits ($S_{1,1}$, $S_{1,2}$).

Figure 5B:
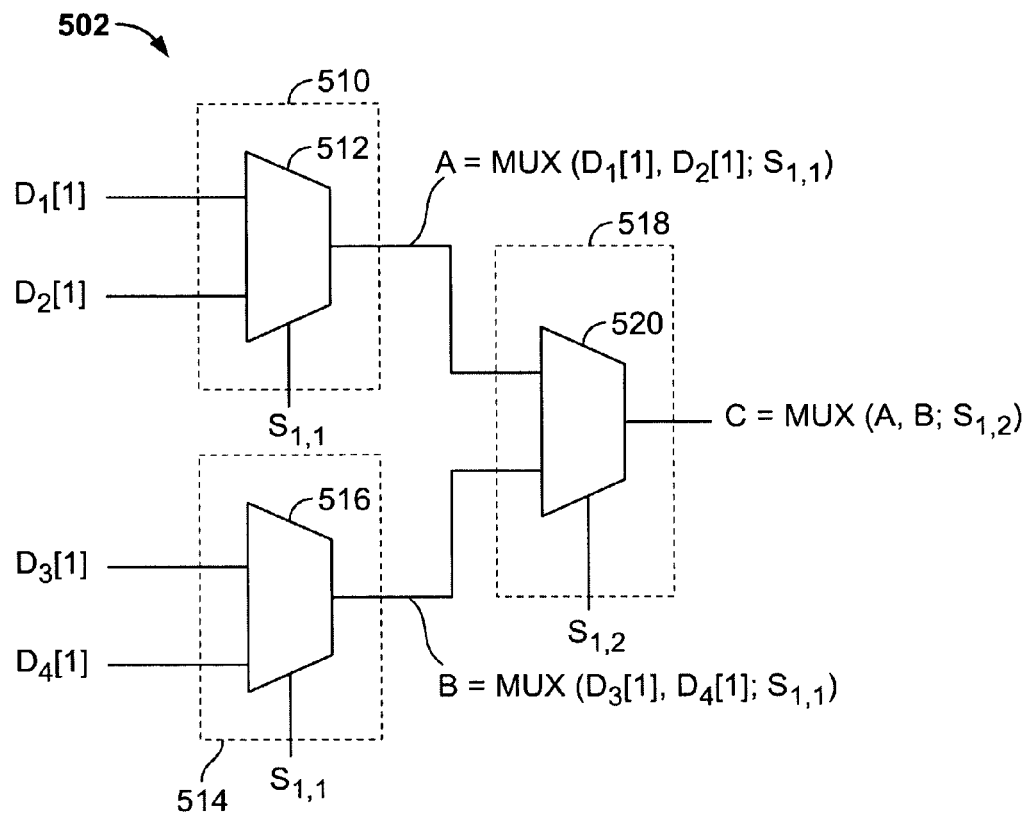
FIGS. 5B–C illustrate alternative implementations of a 4:1 multiplexer in a 4-LUT-based hardware common to programmable logic resources.

A 4:1 multiplexer 502, 504, 506, and 508, which can be recognized, for example, by computer-aided design software, may be implemented using 2:1 multiplexers, for example, in a 4-input LUT-based hardware common to programmable logic resources. As shown in FIG. 5B, in a conventional approach, a first two data inputs ($D_1[1]$, $D_2[1]$) can be input to a first multiplexer 512, and the other two data inputs ($D_3[1]$, $D_4[1]$) can be input to a second multiplexer 516. Mutliplexers 512 and 516 can be controlled by the first select signal ($S_{1,1}$), whose outputs are sent as input to a third multiplexer 520 controlled by the second select signal ($S_{1,2}$). This approach requires three logic elements 510, 514, and 518.

Figure 5C:
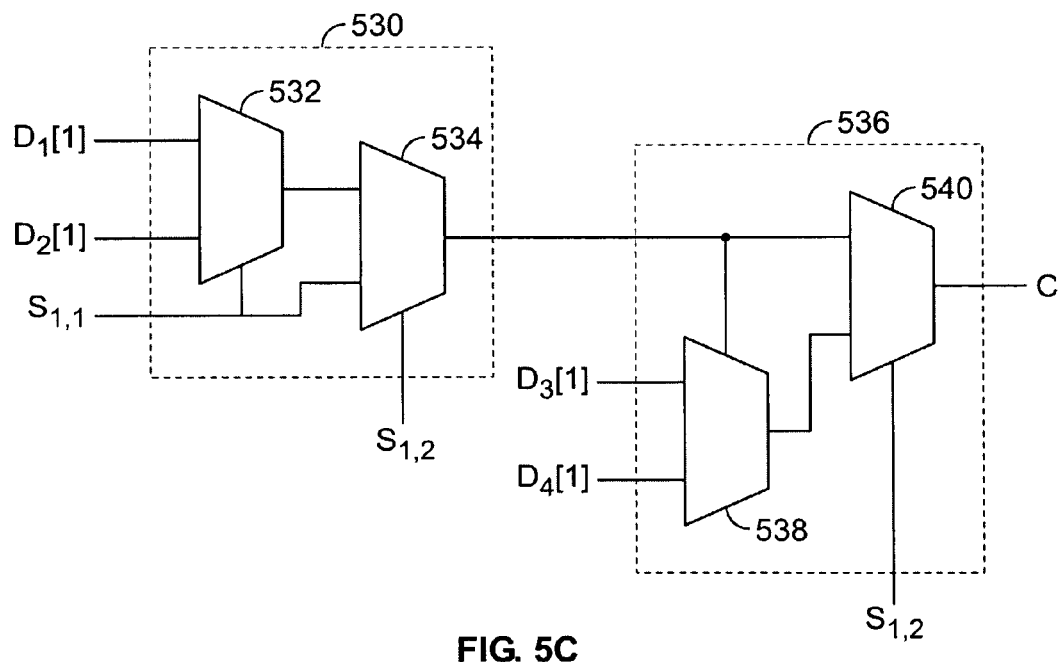

In a more efficient implementation of a 4:1 multiplexer using 2:1 multiplexers in a 4-input LUT-based hardware, as shown in FIG. 5C, the first two data inputs ($D_1[1]$, $D_2[1]$) can be input to a first multiplexer 532. Multiplexer 532 can be controlled by the first select signal ($S_{1,1}$). The output of multiplexer 532 and the first select signal ($S_{1,1}$) can be sent as input to a second multiplexer 534 that is controlled by the second select signal ($S_{1,2}$). The other two data inputs ($D_3[1]$, $D_4[1]$) can be input to a third multiplexer 538. Multiplexer 538 can be controlled by the output of multiplexer 534, with the outputs of multiplexers 534 and 538 being sent as input to a fourth multiplexer 540 that is contolled by the second select signal ($S_{1,2}$). This approach requires only two logic elements 530 and 536. A first logic element 530 can be used to implement multiplexers 532 and 534, and a second logic element 536 can be used to implement multiplexers 538 and 540.

Figure 6:
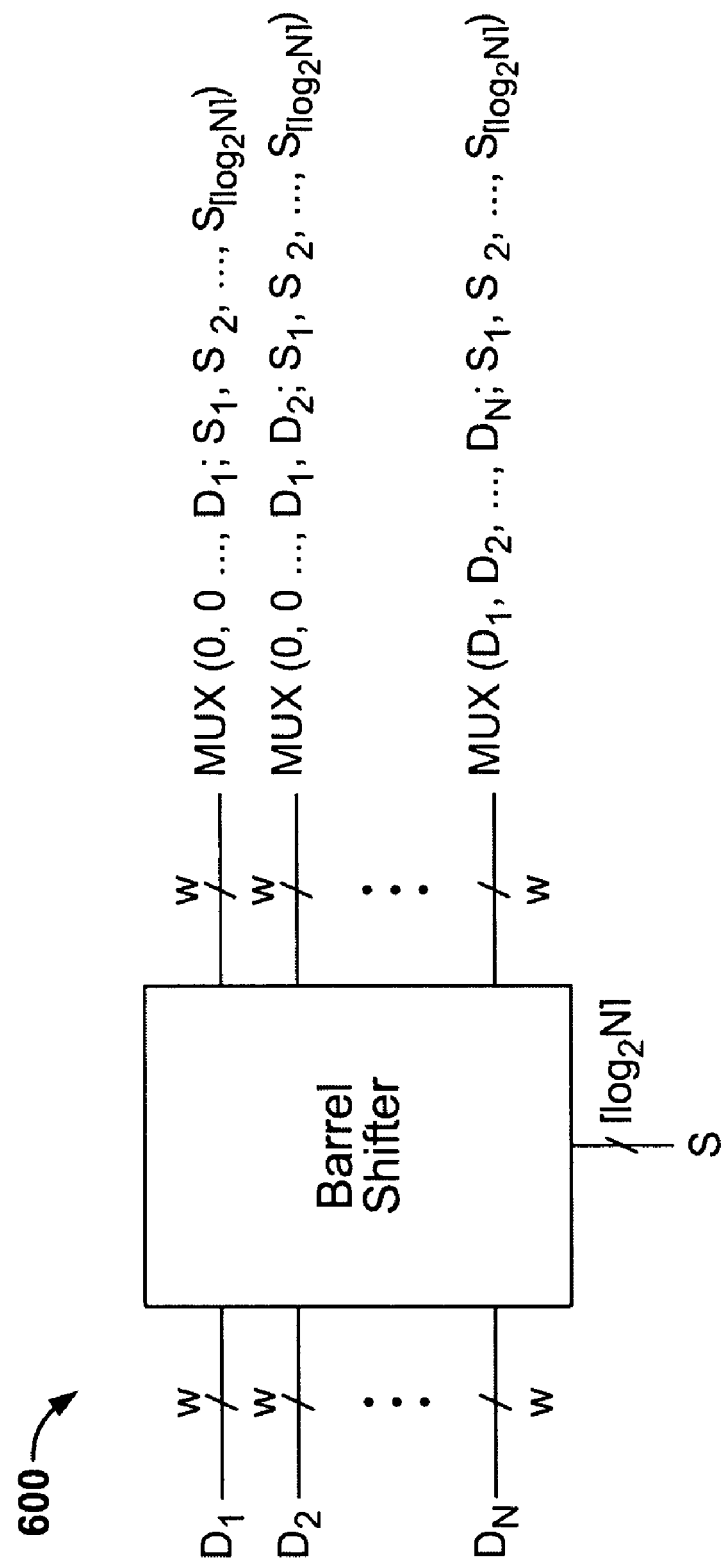
FIG. 6 is a high level diagram illustrating a barrel shifter implementation.
Figure 7A:
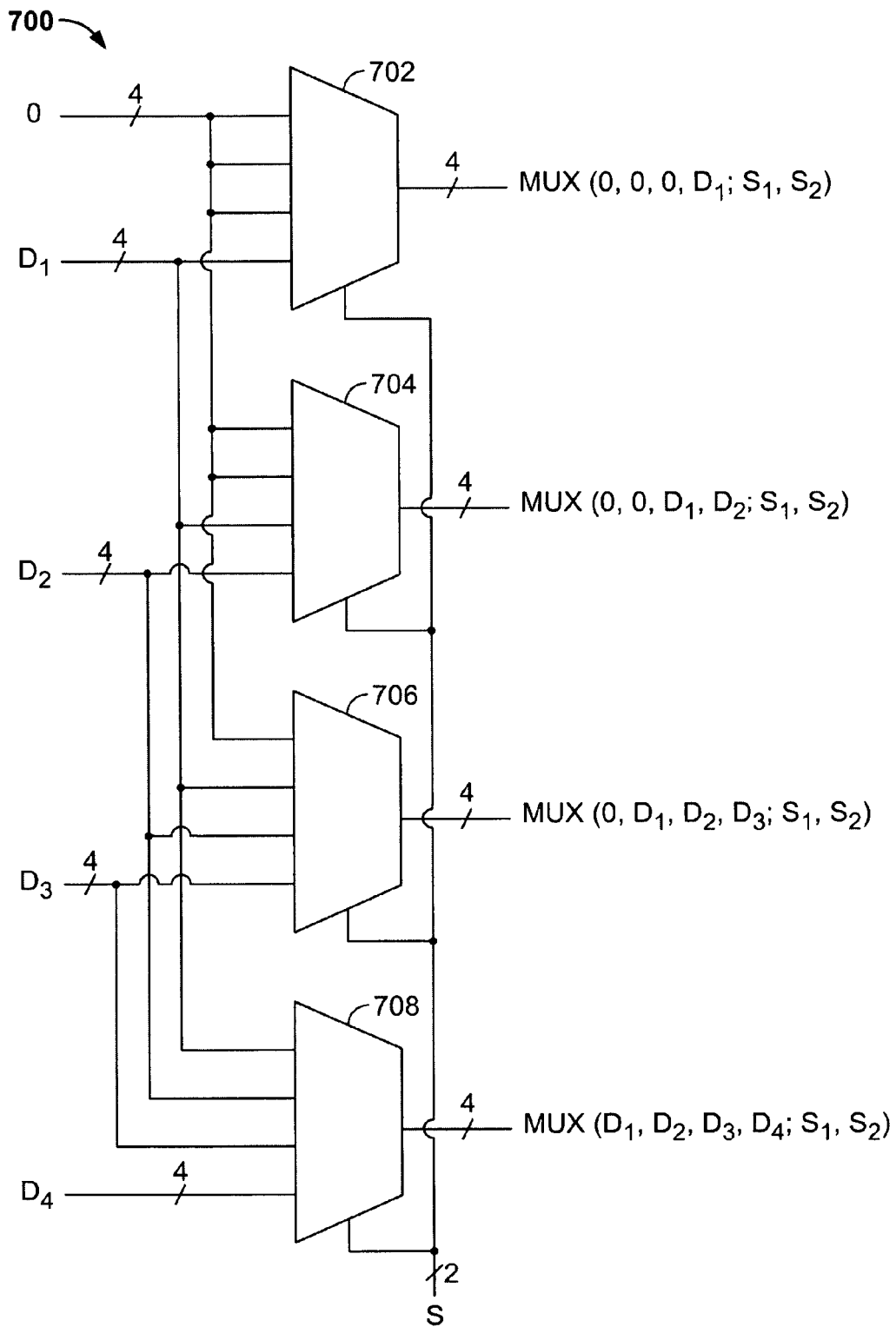
FIGS. 7A–B are diagrams illustrating examples of barrel shifters using a logical representation of multiplexers.

An N-channel barrel shifter 600 of data width w, as shown in FIG. 6, is a modified version of a crossbar where each output is generated from a multiplexer block. For example, as shown in FIG. 7A, a 4-channel uni-directional barrel shifter 700, with each input having four bits, can be implemented using four multiplexer blocks 702, 704, 706, and 708. Each multiplexer block 702, 704, 706, and 708 has only those inputs that can be generated as an output at its output location. For example, multiplexer block 702 has as inputs a first data input ($D_1$) and zero values, multiplexer block 704 has as inputs a first two data inputs ($D_1$, $D_2$) and zero values, multiplexer block 706 has as inputs a first three data inputs ($D_1$, $D_2$, $D_3$) and a zero value, and multiplexer block 708 has as inputs all four data inputs ($D_1$, $D_2$, $D_3$, $D_4$). The output of each multiplexer block 702, 704, 706, and 708 is determined by the same control signal (S), which is, in this case, two bits.

Figure 7B:
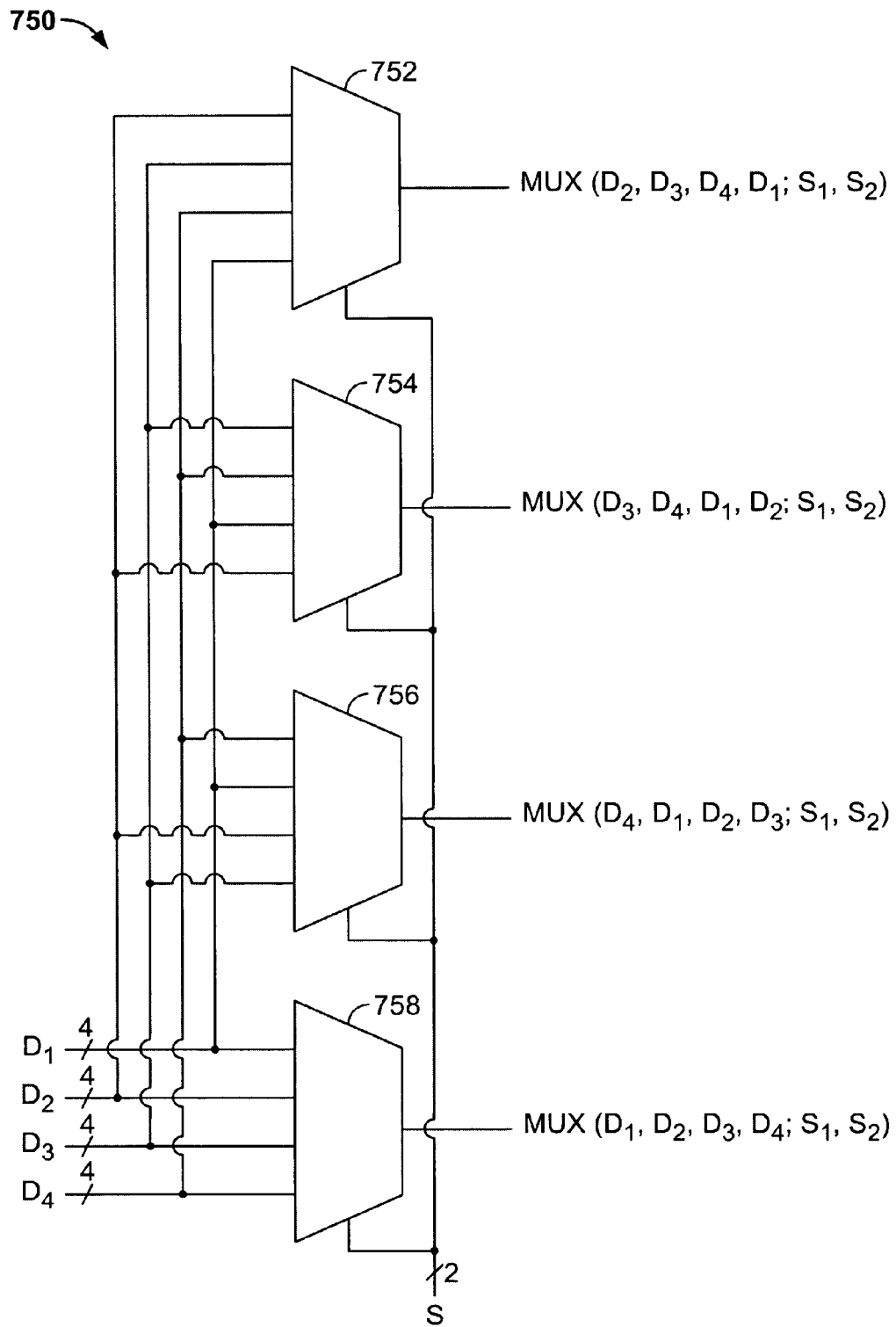

A rotational barrel shifter can also be implemented by replacing the zero input values with the corresponding input values. For example, multiplexer blocks 702, 704, 706, and 708 could have as inputs all four inputs but in different input locations. FIG. 7B illustrates a rotational barrel shifter 750. For multiplexer block 752, a first input can be $D_2$, a second input can be $D_3$, a third input can be $D_4$, and the fourth input can be $D_1$. For multiplexer block 754, a first input can be $D_3$, a second input can be $D_4$, a third input can be $D_1$, and the fourth input can be $D_2$. For multiplexer block 756, a first input can be $D_4$, a second input can be $D_1$, a third input can be $D_2$, and the fourth input can be $D_3$. For multiplexer block 758, a first input can be $D_1$, a second input can be $D_2$, a third input can be $D_3$, and the fourth input can be $D_4$. For any given control signal (S), each of the inputs are output in a related way.

Figure 8:
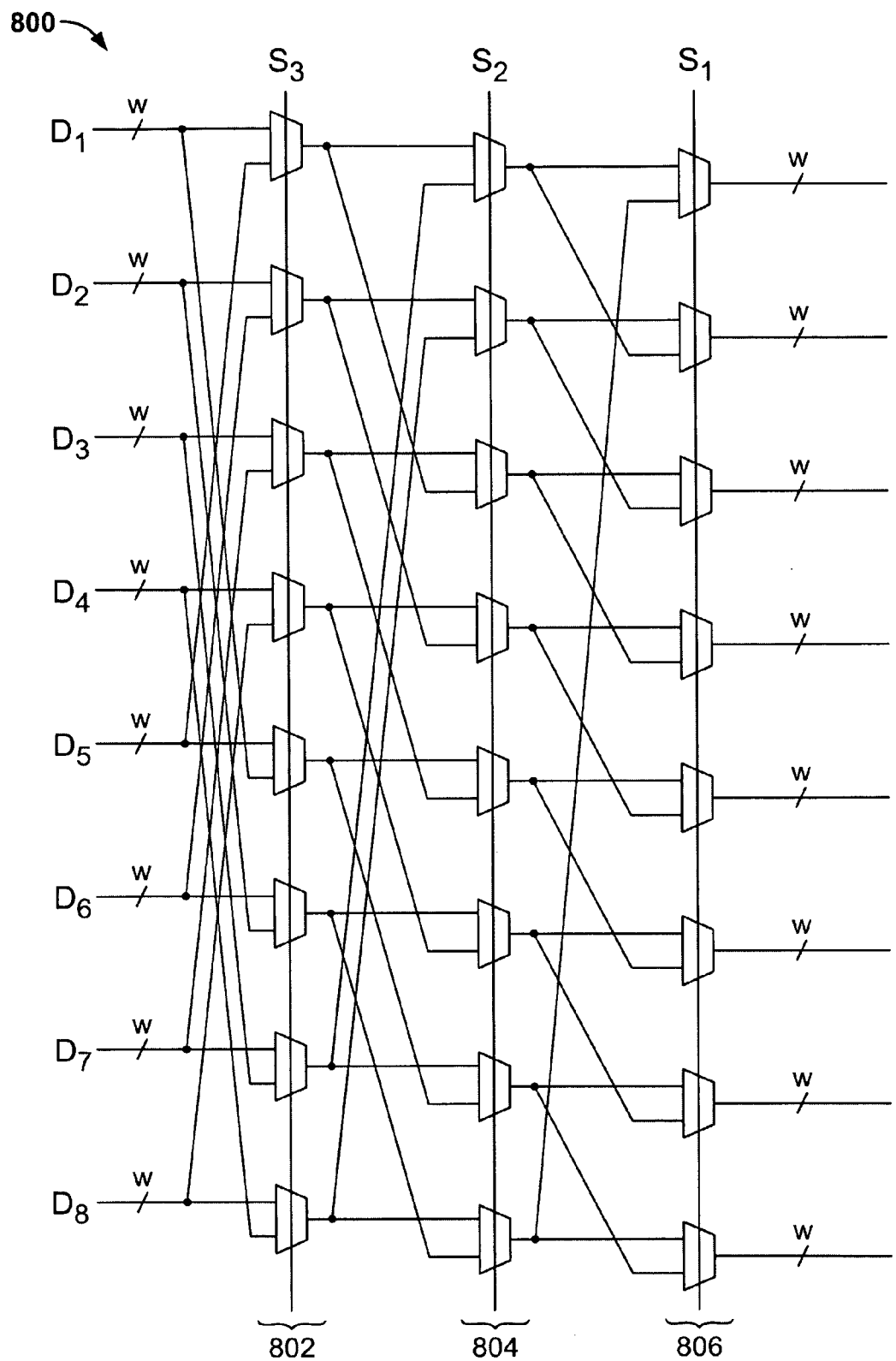
FIG. 8 is a detailed diagram illustrating one example of a more efficient implementation of the barrel shifter in FIG. 6 using a network of multiplexers rather than a direct functional implementation.

A more efficient implementation of a rotational barrel shifter that reduces the number of multiplexers is illustrated in FIG. 8. As an illustration, an 8-channel rotational barrel shifter 800 can include three stages of multiplexers 802, 804, and 806, with each stage being controlled by one bit of the control signal $S3$, $S_2$, and $S_1$, respectively. At each stage, the output is shifted down a number of bits if the corresponding control signal is binary "1," or else propagated to a next stage if the corresponding control signal is binary "0." The use of multiplexers to implement crossbars and/or barrel shifters requires a large number of logic elements and therefore consumes large amounts of area on a programmable logic resource.

The present invention improves the efficiency of implementing crossbars and/or barrel shifters on programmable logic resources by providing dedicated crossbars and/or barrel shifters circuitry. A programmable logic resource may have dedicated crossbar circuitry, dedicated barrel shifter circuitry, or both dedicated crossbar and dedicated barrel shifter circuitry.

The invention is described herein primarily in the context of providing dedicated crossbar and/or barrel shifter circuitry on a programmable logic resource for clarity. It is understood that the different embodiments of the invention include providing dedicated crossbar circuitry on a programmable logic resource, providing dedicated barrel shifter circuitry on a programmable logic resource, and providing both dedicated crossbar circuitry and dedicated barrel shifter circuitry on a programmable logic resource.

A plurality of such programmable logic regions may be arranged in a programmable logic resource. A programmable logic resource with crossbar and/or barrel shifter regions may have other resources (e.g., programmable logic regions, memory, etc.) that are integrated with the crossbar and/or barrel shifter regions for more efficient implementation of, for example, network applications or other applications that involve a combination of logic operations and crossbar and/or barrel shifter operations for suitable operation.

Figure 9:
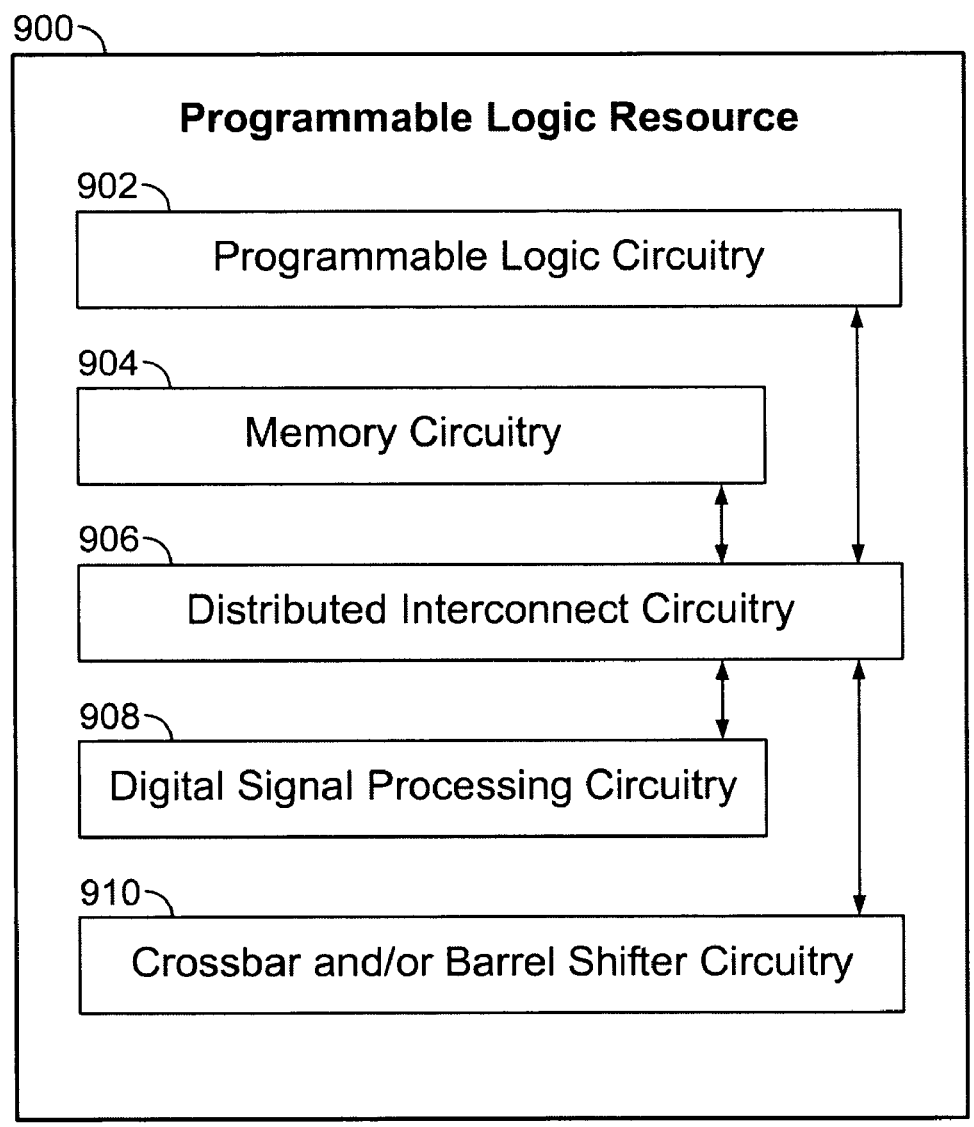
FIG. 9 is a functional block diagram of an illustrative programmable logic resource having crossbar and/or barrel shifter circuitry in accordance with an embodiment of the invention.

A programmable logic resource may have an architecture that is based on concentrating circuitry in different regions based on purpose. For example, with reference now to FIG. 9, programmable logic resource 900 may include programmable logic circuitry 902 (e.g., programmable logic circuitry 902 that is concentrated in block-shaped regions in programmable logic resource 900), memory circuitry 904 (e.g., memory circuitry 904 that is concentrated in block-shaped regions in programmable logic resource 900), digital signal processing circuitry 908 (e.g., digital signal processing circuitry 908 that is concentrated in block-shaped regions in programmable logic resource 900), crossbar and/or barrel shifter circuitry 910 (e.g., crossbar and/or barrel shifter circuitry 910 that is concentrated in block-shaped regions in programmable logic resource 900), and distributed interconnect circuitry 906. Circuitry 902, 904, 908, and 910 may be concentrated in blocked-shaped regions, in one or more columns, in one or more rows, or any other suitable contiguous regions. Crossbar and/or barrel shifter circuitry 910 may be separate from or may be implemented as part of digital signal processing circuitry 908.

Distributed interconnect circuitry 906 may be distributed over programmable logic resource 900 to provide connectivity between programmable logic circuitry 902, memory circuitry 904, digital signal processing circuitry 908, and crossbar and/or barrel shifter circuitry 910. Crossbar and/or barrel shifter circuitry 910 may be substantially mutually exclusive of circuitry, layout, and/or functionality of programmable logic circuitry 902, memory circuitry 904, digital signal processing circuitry 908, and/or distributed interconnect circuitry 906.

The design of a dedicated crossbar and/or barrel shifter can include the following: creation of an abstract model, synthesizing the model to a gate-level design, and determing the placement of the gates and the routing of the interconnections. The abstract model describes the inputs, outputs, and functions of the crossbar and/or barrel shifter using a hardware description language (HDL) such as Very High Speed Integrated Circuit Hardware Decription Language (VHDL) and Verilog. The HDL code, which represents hardware information of the circuitry, can then be synthesized into a gate-level description that describes the circuitry in terms of logic gates and interconnections. The gate-level description can then be imported to a place-and-route tool that generates a netlist describing the electrical connectivity data associated with the circuitry. The place-and-route tool provides the physical location of each component of the circuitry and the interconnections of the different components on the programmable logic resource. Such interconnection can include the connections between the different gates, the connections from the gates to programmable logic regions on the programmable logic resource, or other suitable connections.

A dedicated crossbar and/or barrel shifter block can replace a region of programmable logic. The region of programmable logic can include any suitable number of logic array blocks (LABs). The number of LABs varies depending on the size of the crossbar and/or barrel shifter, in particular the number of inputs and outputs needed. Each LAB includes a predetermined number of logic elements which varies depending on the type of programmable logic resource. For example, for the Stratix devices produced by Altera Corporation of San Jose, Calif.), each LAB includes ten logic elements.

Figure 10:
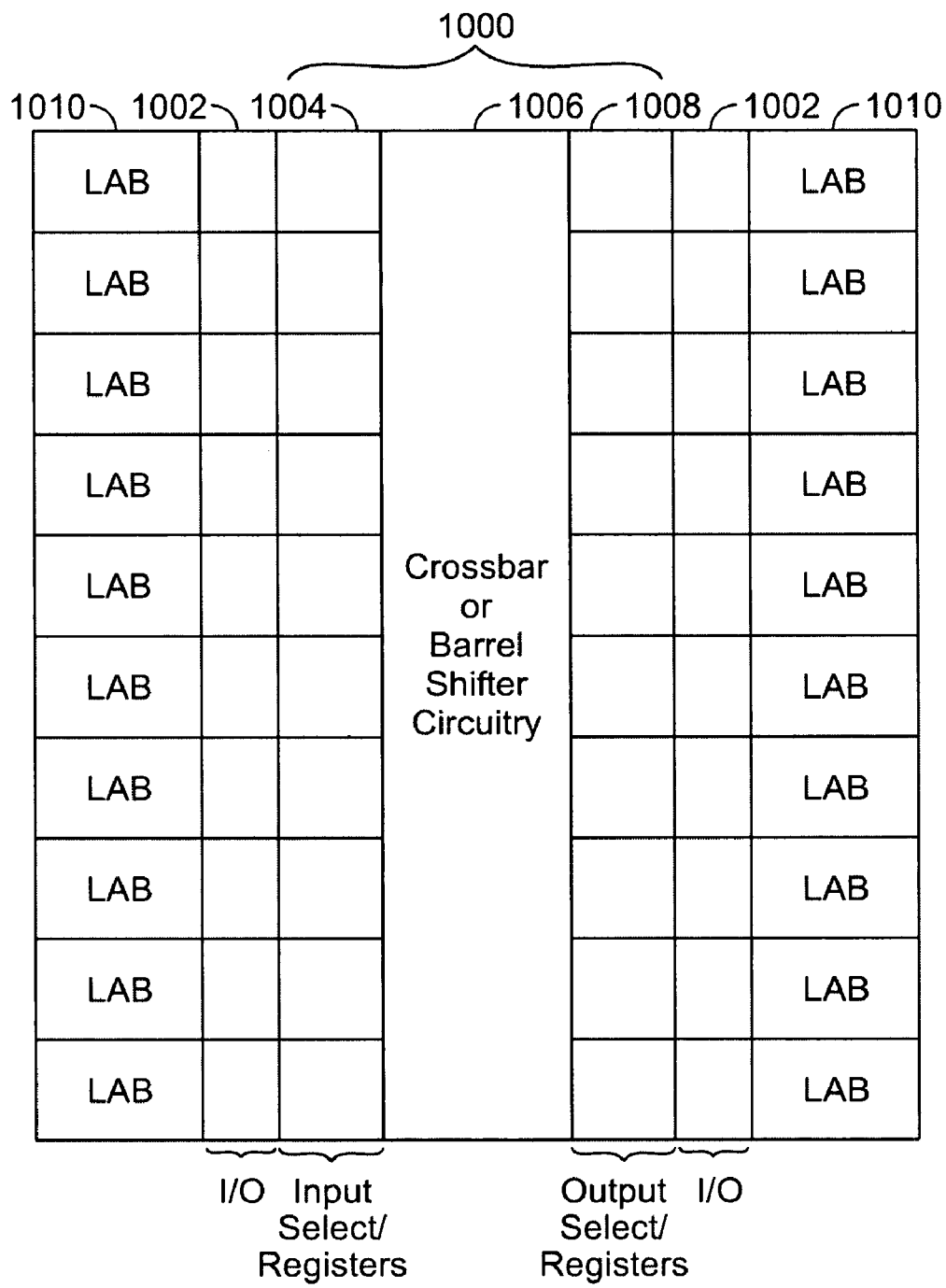
FIG. 10 is a diagram of an illustrative floor plan for a representative portion of a programmable logic resource (e.g., the programmable logic resource of FIG. 9) in accordance with the invention

FIG. 10 illustrates one exemplary embodiment of a crossbar or barrel shifter block 1000. As an illustration and for clarity, FIG. 10 is described in the context of a crossbar or barrel shifter that replaces a 10-LAB block. For example, a 16-input 16-output crossbar of 8-bit width can replace a 10-LAB block. However, in accordance with the invention, a crossbar or barrel shifter can replace any suitable number of LABs 1010. Input select/register circuits 1004 may be arranged to be in a column. One input select/register circuit 1004 in each row may select input signals from adjacent interface circuitry 1002 in the same row and may be programmed to pass input signals to crossbar or barrel shifter circuitry 1006 without registering the input signals.

Output select/register circuits 1008 may be arranged in a column to the right of crossbar or barrel shifter circuitry 1006. Crossbar or barrel shifter circuitry 1006 may feed the inputs of output select/register circuits 1008. Output select/register circuits 1008 may be arranged one to a row, to feed the inputs of interface circuitry 1002 in that same row. Output select/register circuits 1008 may have capabilities, such as programmable output selection, registration of output signals or a combination thereof. In some embodiments, output select/register circuit 1008 may simply be used to control when the output of crossbar or barrel shifter circuitry 1006 is available for use within the rest (e.g., some parts) of a programmable logic resource having crossbar and/or barrel shifter block 1000.

If desired, in some embodiments of crossbar or barrel shifter block 1000, crossbar or barrel shifter block 1000 may be implemented without including input select/register circuits 1004 and/or output select/register circuits 1008. In such embodiments, sufficient local interconnect resources, such as conductors and programmable logic connectors, may be arranged to suitably receive input and to output signals. The arrangement shown in FIG. 10 is merely an illustrative arrangement. Other arrangements may also be used to implement crossbar and/or barrel shifter block 1000.

Figure 11:
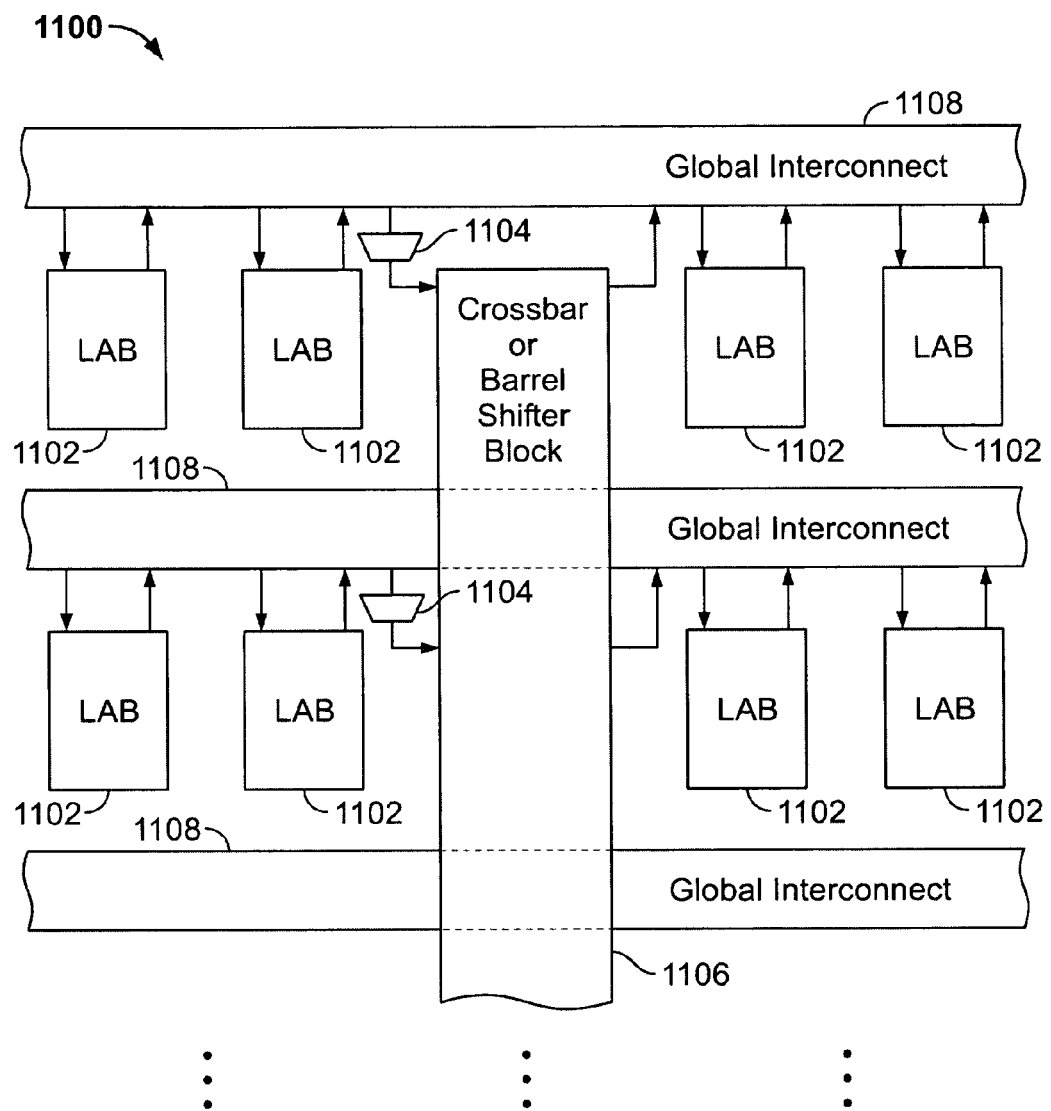
FIG. 11 is a simplified schematic block diagram of representative portions of an illustrative embodiment of a programmable logic resource having programmable logic regions and crossbar and/or barrel shifter circuitry constructed in accordance with the invention.

FIG. 11 is an illustrative programmable logic resource 1100 that includes a two dimensional array of rows and columns of programmable logic and other resources. Programmable logic resource 1100 may include rows and columns of LABs, a crossbar and/or barrel shifter block 1106, and global interconnects 1108. Each LAB 1102 includes a plurality of logic elements that can have local interconnect resources. Each logic element is an area of programmable logic that is programmable to perform any of several logic tasks on signals applied to the logic element to produce one or more logic element output signals. Data may be input to a logic element from the local interconnect within the LAB 1102 or from the horizontal global interconnect 1108 associated with the row of programmable logic from which the logic element is located. Similarly, data may be output from each logic element to the local interconnect within the LAB 1102 or to the corresponding horizontal global interconnect 1108.

A crossbar and/or barrel shifter block 1106 can be located in a column on programmable logic resource 1110 that spans several rows of programmable logic. As described in connection with FIG. 10, the number of rows of each crossbar and/or barrel shifter block 1106 depends on the size of the block and the number of inputs and outputs needed. There may be more than one crossbar and/or barrel shifter block 1106 in the column of programmable logic resource 1100. There may also be more than one column in programmable logic resource 1100 having one or more crossbar and/or barrel shifter blocks 1106. Data from each associated global interconnect 1108 may be input to crossbar and/or barrel shifter block 1106 via a programmable logic connector ("PLC") 1104.

PLCs 1104 are programmable (e.g., by associated function control elements ("FCEs")) to select their input for output to the associated part of crossbar and/or barrel shifter block 1106. Although thus-far described as being programmably (and therefore statically or relatively statically) controlled (e.g., by FCEs), it will be understood that some or all elements referred to herein as PLCs may be alternatively controlled in other ways. For example, a PLC may be controlled by a more dynamic control signal (e.g., a logic signal on programmable logic resource 1100 that can have different logic levels at different times during the post-configuration, "normal" logic operation of the programmable logic resource).

In another embodiment, crossbar and/or barrel shifter block 1106 may receive data from, or send data to, the local interconnect in the LABs 1102 rather than, or in addition to, the global interconnects 1108.

There may also be a vertical global interconnect associated with each region of programmable logic and crossbar and/or barrel shifter block 1106 that is not shown to avoid over-crowding the drawing. The vertical global interconnects can be provided for making general-purpose interconnections between the rows of programmable logic, the crossbar and/or barrel shifter block 1106, and other resources. Although not shown, programmable logic resource 1100 may also include, for example, memory blocks, digital signal processing regions, and other dedicated hardware circuitry.

Figure 12A:
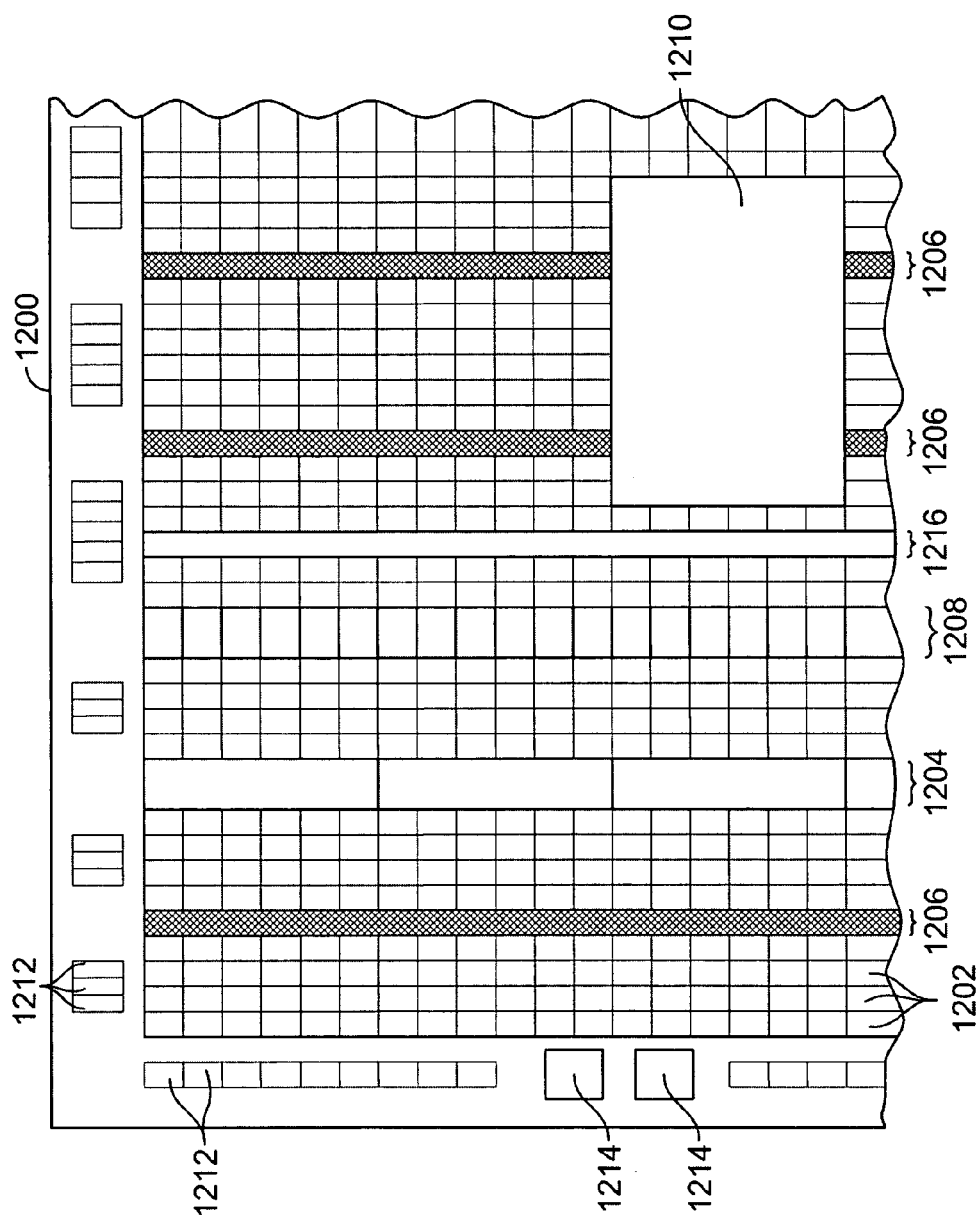
FIGS. 12A–C are diagrams of illustrative top-level floor plans of different illustrative embodiments of a programmable logic resource having dedicated crossbar and/or barrel shifter circuitry in accordance with the invention.
Figure 12B:
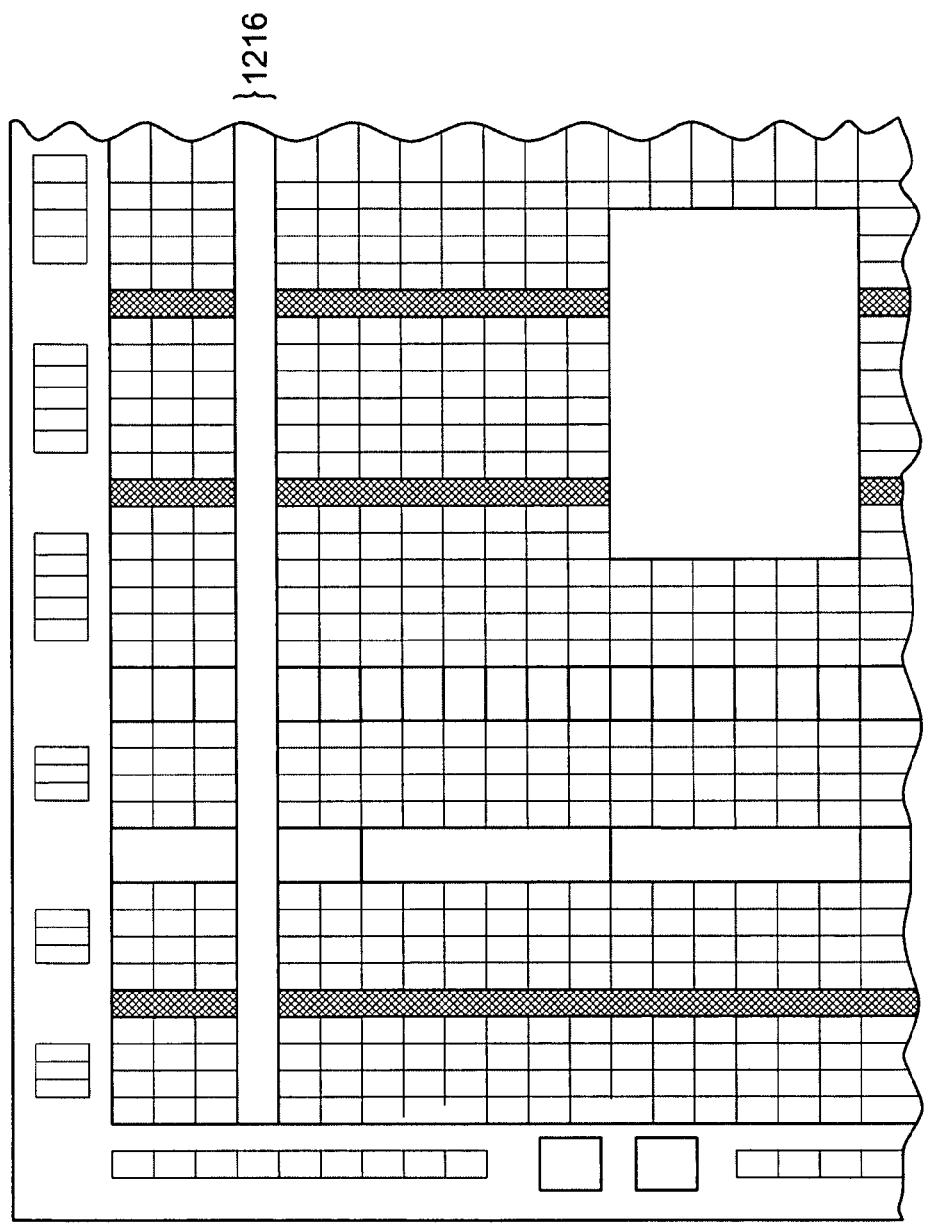
Figure 12C:
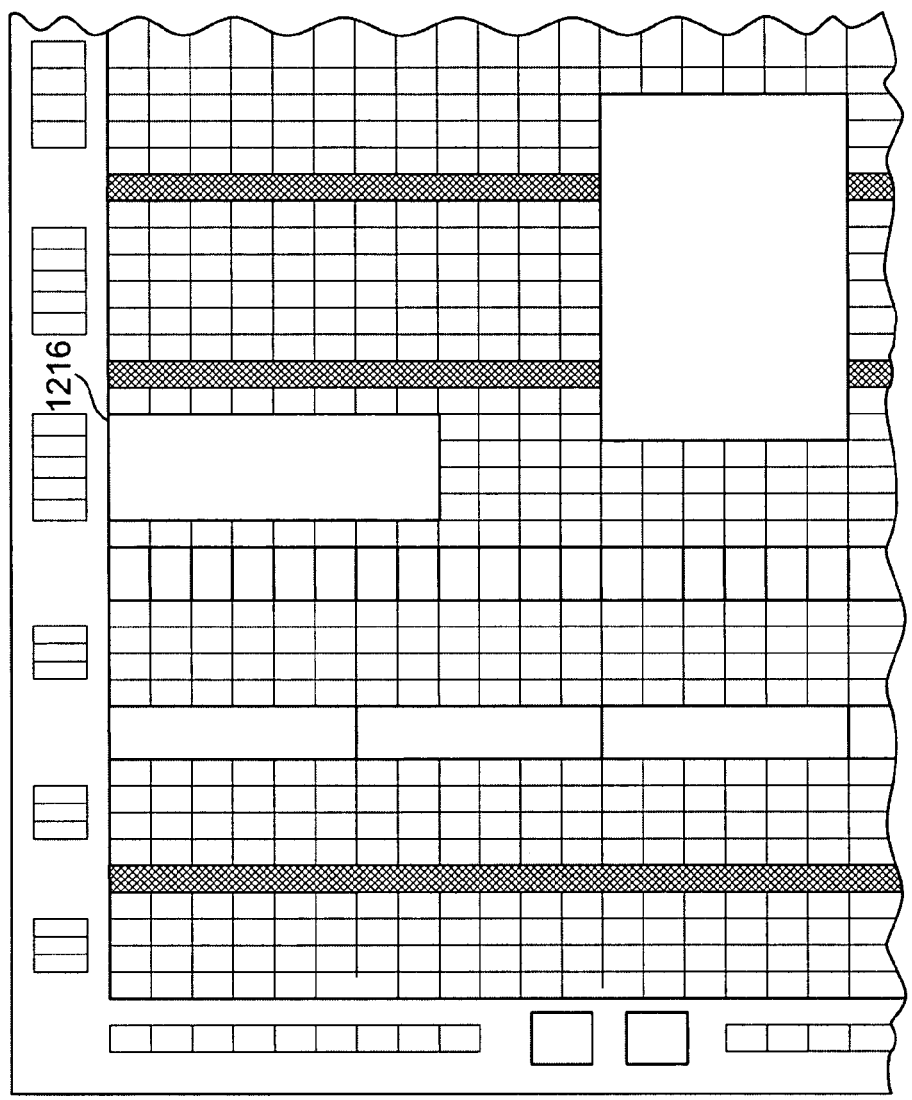

Other arrangements of programmable logic regions, crossbars and/or barrel shifter regions, and other resources may also be used. For example, with reference now to FIG. 12A, programmable logic resource 1200 illustrates a top-level block assignment for a representative portion of one embodiment of a programmable logic resource having one or more crossbar and/or barrel shifter regions. Each region can include one or more crossbar and/or barrel shifter blocks. For clarity and to avoid over-crowding the drawing, the location of some of the circuitry of programmable logic resource 1200, such as global interconnect resources, are not explicitly specified. As shown, programmable logic resource 1200 may include LABs 1202, digital signal processing block 1204, small embedded array blocks 1206 (e.g., 512-bit M512 random access memory (RAM) blocks used in the Stratix devices produced by Altera Corporation of San Jose, Calif.), medium embedded array blocks 1208 (e.g., 4-kilobit M4K RAM blocks used in the Stratix device), memory region 1210 (e.g., 512-kilobit M-RAM block used in the Stratix device), input/output elements (IOEs) 1212, phase-locked loops (PLLs) 1214, and crossbar and/or barrel shifter block 1216. Crossbar and/or barrel shifter region 1216 may replace a column of LABs 1202 as shown in FIG. 12A, a row of LABs as shown in FIG. 12B, and a rectangle of LABs as shown in FIG. 12C. There may be more than once crossbar and/or barrel shifter region 1216 that replaces multiple rows, columns, rectangles, a combination of the same, or any other suitable region on the programmable logic resource. To avoid over-complicating the drawing, a single column (FIG. 12A), a single row (FIG. 12B), and a single rectangle (FIG. 12C) are shown. While FIGS. 12A–C show an illustration of one type of programmable logic resource 1200, the invention applies to other suitable types of programmable logic resources having different layouts of the various regions on the programmable logic resources and having different types of regions on the programmable logic resources.

An integer number of crossbars and/or barrel shifter blocks may be included in a column, a row, or a rectangle 1216 of programmable logic resource 1200. Although not shown, filler cells may be used in some of the rows (in FIGS. 12A and 12C) or columns (in FIGS. 12B and 12C) in crossbar and/or barrel shifter region 1216 to provide an interface for logic array blocks 1202 neighboring a row or column that does not include circuitry for one of the crossbars and/or barrel shifters. The number of crossbars and/or barrel shifter blocks may depend on various factors such as, for example, the size of the crossbars and/or barrel shifters, the input and output capacity of each LAB, the number of equivalent LABs in the dedicated block, and other suitable factors. For example, in one embodiment, a 16-input 16-output crossbar of 8-bit width can be implemented by replacing a block of ten LABs. Accordingly, each crossbar and/or barrel shifter may extend across a specific number of rows (FIG. 12A), a specific number of columns (FIG. 12B), or a specific number of rows and columns (FIG. 12C) of LABs 1202.

While crossbar and/or barrel shifter region 1216, which includes areas concentrated with crossbar and/or barrel shifter circuitry, may be provided in programmable logic resource 1200 at the expense of layout space for other components of programmable logic resources, this loss may be minimized if an application run on the programmable logic resource uses crossbars and/or barrel shifters.

Each LAB 1202 may include a programmable logic element and registers to implement simple, single-level logic functions, such as, for example, to implement one bit of an adder. Small embedded array blocks 1206 and medium embedded array blocks 1208 may be used to implement memory or logic functions. Small embedded array blocks 1206 and medium embedded array blocks 1208 may be programmable logic circuitry that may be used to implement single-stage logic functions that are more complex than logic functions available through individual logic array blocks 1202. Small embedded array blocks 1206 and medium embedded array blocks 1208 may be programmable circuitry that can be configured to operate as memory (e.g., RAM). Small embedded array blocks 1206 and medium embedded array blocks 1208 may have a greater number of input lines than an individual logic array block 1202. Small embedded array blocks 1206 and medium embedded array blocks 1208 may each have a larger footprint than an individual logic array block 1202. Memory region 1210 may be a block of random access memory circuitry. Input/output elements 1212 may be input/output interface circuitry for communicating with circuitry external to programmable logic resource 1200. PLL circuitry 1214 may be circuitry programmed to provide a modified clock output signal which has a desired frequency relationship to the input clock signal.

Although not shown, programmable logic resource 1200 may also have an address register row and a data register column extending across programmable logic resource 1200. The address register row may include register circuitry that is used to route signals to different addresses in programmable logic resource 1200. The data register column may include register circuitry that is used to route data or control signals.

While implementing the crossbar and/or barrel shifter circuitry in dedicated hardware requires little actual area in the programmable logic resource, the size of the crossbar and/or barrel shifter is typically limited by the available number of input and output signals. To further improve the functionality of crossbar and/or barrel shifter circuitry in a programmable logic resource, the crossbar and/or barrel shifter circuitry can employ time-multiplexing on the input and output signals. The use of time-multiplexing allows for an increase in the number of dedicated crossbars and/or barrel shifters that can be implemented in a row, column, or rectangle of a programmable logic resource.

In time-multiplexing, each input and output internally has two sets of registers. Data is sent in as input over two consecutive clock cycles and data is sent out as output over another two consecutive clock cycles. For example, in a first clock cycle, a first half of the input data is stored in a first register. In a second clock cycle, a second half of the input data is stored in a second register and an operation (e.g., a crossbar or barrel shifter operation) is performed on the input data. At the conclusion of the operation, data is output from the crossbar or barrel shifter circuitry over two clock cycles.

Figure 13:
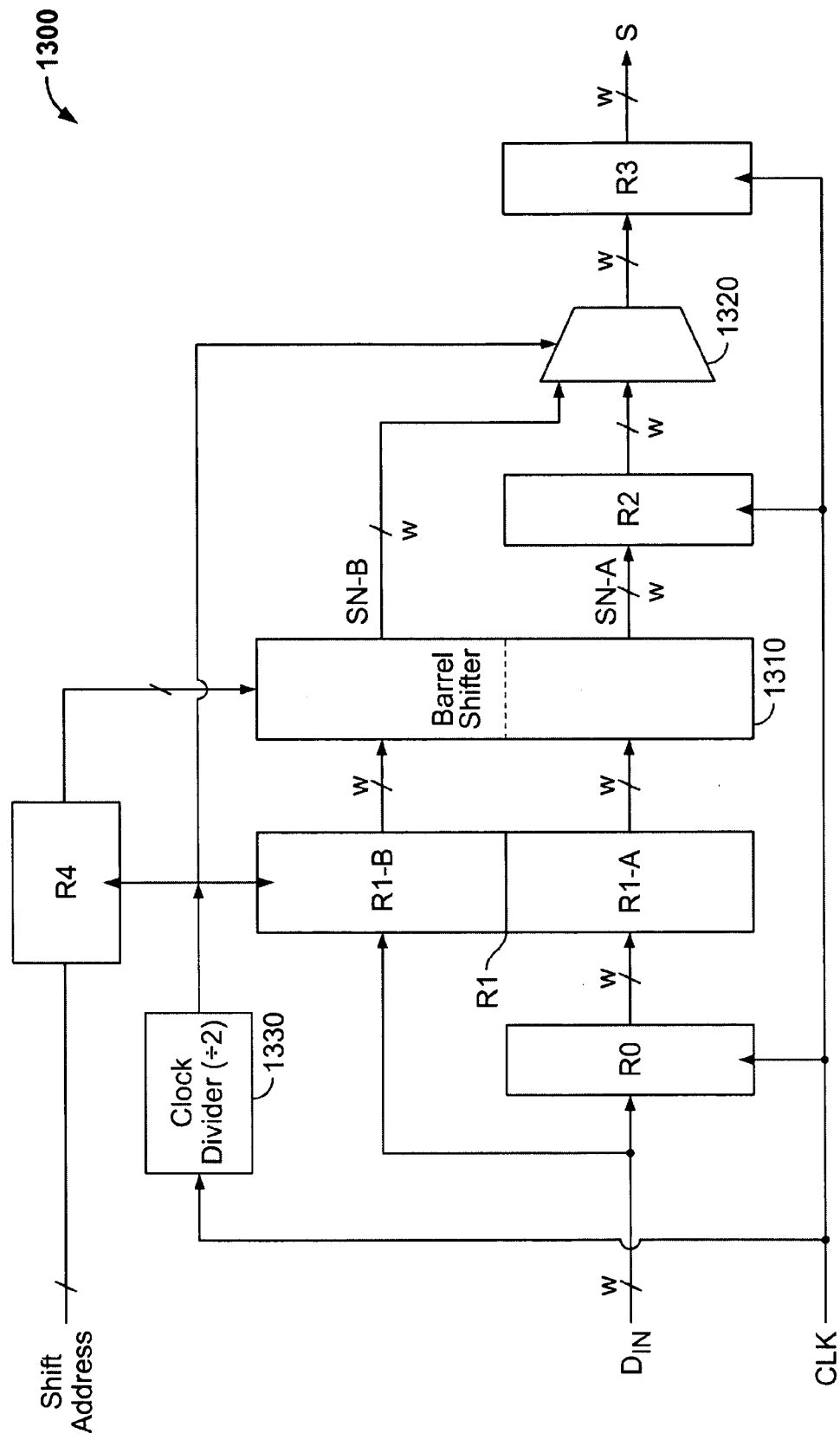
FIG. 13 is a functional block diagram of an illustrative pipelined barrel shifter in accordance with the invention.

Depending on the size of a barrel shifter, a barrel shifter can replace one or more LABs in a programmable logic resource. For example, in one embodiment, a 32-bit barrel shifter can replace a single logic array block. Because, a 32-bit barrel shifter requires 38 inputs (32 data bits, 5 address bits, and 1 clock bit) and 32 outputs, a single logic array block's routing resources may not able to handle such a large number of inputs and outputs. Implementing a pipelined time-multiplexed barrel shifter reduces the number of inputs and outputs, thereby allowing the barrel shifter to meet the routing resources of the logic array block. FIG. 13 shows an illustrative pipelined time-multiplexed barrel shifter block 1300.

Barrel shifter block 1300 includes registers R0, R1, R2, R3, and R4, a barrel shifter 1310 implemented in hardware and not programmable, multiplexers 1320, and a clock divider 1330. For a 32-bit barrel shifter 1410, registers R0, R2, and R3 can store at least 16 data bits. Register R1 can store at least 32 bits, with each of registers R1-A and R1-B holding at least 16 bits. Register R4 can store at least 5 bits to allow barrel shifter 1320 to shift by up to 32 ($2^5$) locations. There can be 16 2:1 multiplexers 1320 used to output the barrel-shifted data. FIG. 13 is described herein in the context of a 32-bit barrel shifter 1310 for clarity, although the invention applies to a barrel shifter of other suitable sizes. It will be understood that for barrel shifters of other sizes, the sizes of registers R0–R4 and the number of multiplexers 1320 will vary accordingly.

Input data $D_{IN}$ is sent to barrel shifter block 1300 over two clock cycles and data S-OUT is sent out of barrel shifter block 1300 over two clock cycles. The input data $D_{IN}$ sends a first half of the data (e.g., 16 bits for a 32-bit barrel shifter) to register R0 in block 1300. When the input data $D_{IN}$ sends the second half of the data to block 1300 in a next clock cycle, this data, along with the first half of the data stored in register R0, are sent to register R1 (e.g., $R1_B$ and $R1_A$, respectively) where the data is loaded into barrel shifter 1310 and processed. A shift address is stored in register R4 and sent to barrel shifter 1310. The shift address provides a number of bits a given set of data should be shifted by. Once the data is processed in barrel shifter 1310, half of the processed data (SN-A) is stored in register R2 while the other half (SN-B) is sent through multiplexers 1320 and stored in register R3 to be sent as output data S-OUT. In a next clock cycle, the data stored in register R2 is sent through multiplexers 1320 and stored in register R3 to be sent as output data S-OUT. The clock (CLK) controls the input of data into (e.g., R0) and the output of data from (e.g., R3) barrel shifter block 1300. Clock divider 1330 divides the CLK signal by two and directs barrel shifter 1310 to perform a barrel shift operation on the data only after both halves of a given set of data have been loaded into register R1. Clock divider 1330 also serves as a control signal to select the inputs to sent to the output of multiplexers 1320.

Figure 15:
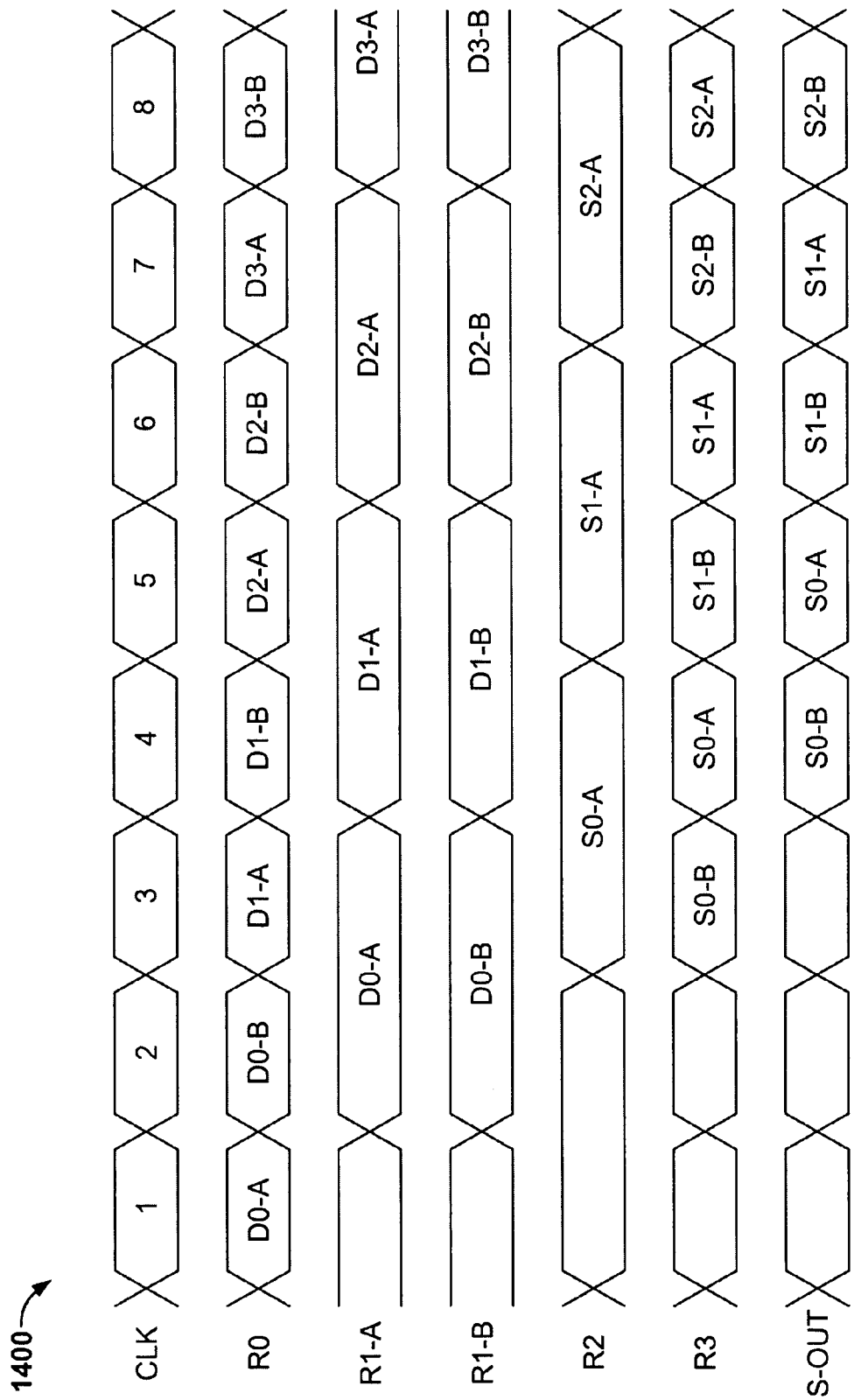

FIGS. 14–15 are alternative views of timing diagram 1400 of data being sent through time-multiplexed barrel shifter block 1300. Data can be loaded into the registers and other combinatorial logic on a rising edge of a clock, a falling edge of a clock, or both a rising and falling edge of a clock. For clarity, FIGS. 14–15 are described herein in the context of data being loaded and signals being sent during a rising edge of a clock.

Prior to valid data being loaded into various registers, the contents in those registers are not important and have been designated with an "X" (in FIG. 14) or left blank (in FIG. 15). Although not shown, barrel shifter block 1300 may need at least two clock cycles for intialization. Data DIN that is to be barrel-shifted in barrel shifter 1310 is sent over two clock cycles (each set of data is labeled D0, D1, D2, etc., with each half of the data for a given set being represented by an "A" or "B"). In a first CLK cycle, a first half of data D0 (D0-A) is loaded into register R0. In a second CLK cycle, clock divider 1330 is also clocked. Clock divider 1430 clocks register R1 every other clock cycle (e.g., CLK cycles 2, 4, 6, 8, 10, etc.). Data D0-A is loaded into register R1-A. At the same time, a second half of data D0 (D0-B) is loaded into registers R0 and R1-B.

Data D0 in register R1 is barrel shifted to produce resulting data S0 so that by a third CLK cycle, a first half of data S0 (S0-A) is stored in register R2 and a second half of data S0 (S0-B) is selected by multiplexers 1320 to be output to register R3. Also during the third CLK cycle, a first half of data D1 (D1-A) is loaded into register R0.

In a fourth CLK cycle, data in register R3 (S0-B) is sent as output data S-OUT and the contents of register R2 (S0-A) are sent through multiplexers 1320 and loaded into register R3. Also in the fourth CLK cycle, data D1-A is loaded into register R1-A and a second half of data D1 (D1-B) is loaded into registers R0 and R1-B.

In a fifth CLK cycle, data in register R3 (S0-A) is sent as output data S-OUT. Data D1 in register R1 is barrel shifted to produce resulting data S1 so that by the fifth CLK cycle, a first half of data S1 (S1-A) is stored in register R2 and a second half of data S1 (S1-B) is selected by multiplexers 1320 to be output to register R3. Also during the fifth CLK cycle, a first half of data D2 (D2-A) is loaded into register R0.

In a sixth CLK cycle, data in register R3 (S1-B) is sent as output data S-OUT and the contents of register R2 (S1-A) are sent through multiplexers 1320 and loaded into register R3. Also in the sixth CLK cycle, data D2-A is loaded into register R1-A and a second half of data D2 (D2-B) is loaded into registers R0 and R1-B. Beginning at the fourth CLK cycle, data is output from barrel shifter block 1300 each clock cycle.

FIGS. 14–15 illustrate "A" as representing a lower least significant number of bits and "B" as representing an upper most significant number of bits for a given set of data. However, data may be input to and output from barrel shifter block 1300 in any suitable order with appropriate changes to the routing of signals to registers R0, R1, R2, and multiplexers 1320.

While the time-multiplexed barrel shifter is described primarily in the context of a barrel shifter that pipelines input and output data over two clock cycles for clarity and specificity, the invention can be implemented using a time-multiplexed barrel shifter that pipelines input and output data over any suitable number of clock cycles. To pipeline input and output data over multiple cycles would require additional registers and circuitry to coordinate the flow of data into and out of the barrel shifter block and would also require a different clock divider. These other embodiments would be limited by various factors including, for example, the amount of area needed to implement the additional registers and circuitry, the available routing resources available, and the resulting latency. In yet another embodiment, the time-multiplexed barrel shifter can be designed to be able to pipeline input and output data over a variable number of clock cycles depending on the specific requirements of a given application to be run on the programmable logic resource.

Figure 16:
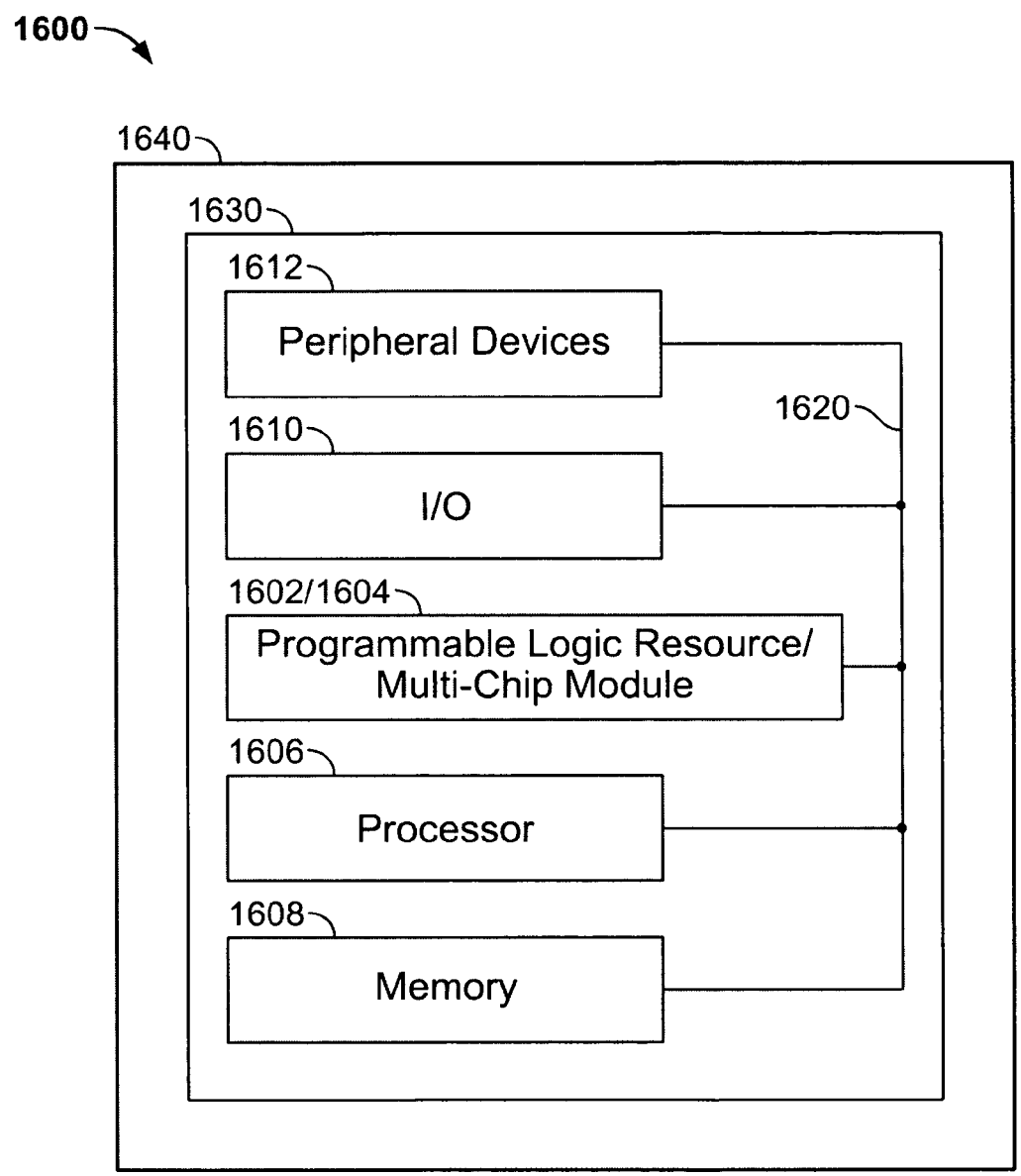
FIG. 16 is a simplified schematic block diagram of an illustrative system employing a programmable logic resource in accordance with the invention.

FIG. 16 illustrates a programmable logic resource 1602 or multi-chip module 1604 which includes embodiments of this invention in a data processing system 1600. Data processing system 1600 can include one or more of the following components: a processor 1606, memory 1608, I/O circuitry 1610, and peripheral devices 1612. These components are coupled together by a system bus or other interconnections 1620 and are populated on a circuit board 1630 which is contained in an end-user system 1640.

System 1600 can be used in a wide variety of applications, such as computer networking, data networking, instrumentation, video processing, digital signal processing, or any other application where the advantage of using programmable or reprogrammable logic is desirable. Programmable logic resource/module 1602/1604 can be used to perform a variety of different logic functions. For example, programmable logic resource/module 1602/1604 can be configured as a processor or controller that works in cooperation with processor 1606. Programmable logic resource/module 1602/1604 may also be used as an arbiter for arbitrating access to a shared resource in system 1600. In yet another example, programmable logic resource/module 1602/1604 can be configured as an interface between processor 1606 and one of the other components in system 1600. It should be noted that system 1600 is only exemplary, and that the true scope and spirit of the invention should be indicated by the following claims.

Various technologies can be used to implement programmable logic resources 1602 or multi-chip modules 1604 having the features of this invention, as well as the various components of those devices (e.g., programmable logic connectors ("PLCs") and programmable function control elements ("FCEs") that control the PLCs). For example, each PLC can be a relatively simple programmable connector such as a switch or a plurality of switches for connecting any one of several inputs to an output. Alternatively, each PLC can be a somewhat more complex element that is capable of performing logic (e.g., by logically combining several of its inputs) as well as making a connection. In the latter case, for example, each PLC can be a product term logic, implementing functions such as AND, NAND, OR, or NOR. Examples of components suitable for implementing PLCs include EPROMs, EEPROMs, pass transistors, transmission gates, antifuses, laser fuses, metal optional links, etc. PLCs and other circuit components may be controlled by various, programmable, function control elements ("FCEs"). For example, FCEs can be SRAMS, DRAMS, magnetic RAMS, ferro-electric RAMS, first-in first-out ("FIFO") memories, EPROMS, EEPROMs, function control registers, ferro-electric memories, fuses, antifuses, or the like. From the various examples mentioned above it will be seen that this invention is applicable to both one-time-only programmable and reprogrammable resources.

Thus it is seen that dedicated hardware circuitry is provided for implementing crossbars and/or barrel shifters in programmable logic resources. One skilled in the art will appreciate that the invention can be practiced by other than the prescribed embodiments, which are presented for purposes of illustration and not of limitation, and the invention is limited only by the claims which follow.

What is claimed is:

1. A programmable logic resource comprising:
a plurality of programmable logic regions;
a crossbar and/or barrel shifter hardware block that employs time-multiplexing; and
interconnect resources that interconnect the crossbar and/or barrel shifter hardware block to at least some of the programmable logic regions,
wherein the crossbar and/or barrel shifter hardware block is operative to receive as input data over a first two consecutive clock cycles and to apply a crossbar and/or barrel shifter operation to the data received during the first two consecutive clock cycles during a same clock cycle.

2. The programmable logic resource of claim 1 wherein the interconnect resources send data from at least some of the programmable logic regions to the crossbar and/or barrel shifter hardware block as input.

3. The programmable logic resource of claim 1 wherein the interconnect resources receive output data from the crossbar and/or barrel shifter hardware block to send to at least some of the programmable logic regions.

4. The programmable logic resource of claim 1 wherein the plurality of programmable logic regions comprises an array of rows and columns of logic array blocks, wherein each logic array block comprises a plurality of logic elements.

5. The programmable logic resource of claim 4 wherein the crossbar and/or barrel shifter hardware block occupies multiple rows in a column of the logic array blocks, wherein the number of rows in the column is determined by a number of inputs and outputs needed by the crossbar and/or barrel shifter hardware block.

6. The programmable logic resource of claim 4 wherein the crossbar and/or barrel shifter hardware block occupies multiple columns in a row of the logic array blocks, wherein the number of columns in the row is determined by a number of inputs and outputs needed by the crossbar and/or barrel shifter hardware block.

7. The programmable logic resource of claim 4 wherein the crossbar and/or barrel shifter hardware block occupies multiple contiguous rows and columns in the array of the logic array blocks, wherein the number of rows and columns in the array is determined by a number of inputs and outputs needed by the crossbar and/or barrel shifter hardware block.

8. The programmable logic resource of claim 1 wherein the crossbar and/or barrel shifter hardware block
is further operative to send as output data resulting from the crossbar and/or barrel shifter operation over a second two consecutive clock cycles.

9. A digital processing system comprising:
processing circuitry;
a memory coupled to the processing circuitry;
a programmable logic resource as defined in claim 1 coupled to the processing circuitry and the memory.

10. A printed circuit board on which is mounted a programmable logic resource as defined in claim 1.

11. The printed circuit board defined in claim 10 further comprising:
a memory mounted on the printed circuit board and coupled to the programmable logic resource.

12. The printed circuit board defined in claim 10 further comprising:
processing circuitry mounted on the printed circuit board and coupled to the programmable logic resource.

13. A method comprising:
routing first input signals to circuitry employing time-multiplexing during a first clock cycle, wherein the circuitry is concentrated in a particular area of a programmable logic resource and is dedicated to a crossbar and/or barrel shifter operation;
routing second input signals to the circuitry during a second clock cycle; and
applying a crossbar and/or barrel shifter operation to the first input signals and the second input signal during a same clock cycle using the circuitry.

14. The method of claim 13 further comprising applying the input signals to the circuitry using interconnect resources of the programmable logic resource.

15. The method of claim 13 further comprising:
producing an output using the circuitry that is based on the crossbar and/or barrel shifter operation;
routing a first half of the output to a programmable logic region in the programmable logic resource during a third clock cycle; and
routing a second half of the output to the programmable logic region during a fourth clock cycle.

* * * * *